United States Patent
Kim et al.

(10) Patent No.: US 12,255,667 B2
(45) Date of Patent: Mar. 18, 2025

(54) METHOD AND APPARATUS FOR PERFORMING CHANNEL CODING OF UE AND BASE STATION IN WIRELESS COMMUNICATION SYSTEM

(71) Applicant: LG ELECTRONICS INC., Seoul (KR)

(72) Inventors: Sungjin Kim, Seoul (KR); Byoung Hoon Kim, Seoul (KR); Kyung Ho Lee, Seoul (KR); Jaehoon Chung, Seoul (KR); Jongwoong Shin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 75 days.

(21) Appl. No.: 18/029,351

(22) PCT Filed: May 14, 2021

(86) PCT No.: PCT/KR2021/006104
§ 371 (c)(1),
(2) Date: Mar. 29, 2023

(87) PCT Pub. No.: WO2022/071642
PCT Pub. Date: Apr. 7, 2022

(65) Prior Publication Data
US 2023/0361789 A1    Nov. 9, 2023

(30) Foreign Application Priority Data
Sep. 29, 2020   (KR) .......... 10-2020-0127424

(51) Int. Cl.
*H03M 13/13* (2006.01)
*H03M 13/00* (2006.01)

(52) U.S. Cl.
CPC ....... *H03M 13/13* (2013.01); *H03M 13/6502* (2013.01); *H03M 13/6561* (2013.01)

(58) Field of Classification Search
CPC ............. H03M 13/6561; H03M 13/13; H03M 13/6502; H03M 13/6597; H03M 13/611;
(Continued)

(56) References Cited

U.S. PATENT DOCUMENTS

2016/0071010 A1*   3/2016  Tian ..................... G06N 3/08
                                                  706/25
2018/0357530 A1*  12/2018  Beery .................. H04L 1/0045
(Continued)

FOREIGN PATENT DOCUMENTS

CN          110798228          2/2020

OTHER PUBLICATIONS

Q. Xu, C. Zhang, L. Zhang and Y. Song, "The Learning Effect of Different Hidden Layers Stacked Autoencoder," 2016 8th International Conference on Intelligent Human-Machine Systems and Cybernetics (IHMSC), Hangzhou, China, 2016.*
(Continued)

*Primary Examiner* — Steve N Nguyen
(74) *Attorney, Agent, or Firm* — LEE, HONG, DEGERMAN, KANG & WAIMEY

(57) ABSTRACT

The present disclosure a method of operating user equipment (UE) in a wireless communication system, the method comprising: identifying layer information that is applied to a neural polar code; generating, based on the identified layer information, transmission data by encoding data that is input into the neural polar code; and transmitting the transmission data to a base station, wherein, based on polar code transformation, the neural polar code generates the transmission data by performing encoding, based on the polar code transformation, from an initial layer of the data to a first
(Continued)

layer according to the identified layer information and by performing encoding through a neural network-based autoencoder after the first layer until the transmission data is generated.

11 Claims, 25 Drawing Sheets

(58) Field of Classification Search
CPC .......... G06N 3/04; G06N 3/08; G06N 3/0455; G06N 3/082
See application file for complete search history.

(56) References Cited

U.S. PATENT DOCUMENTS

| | | | |
|---|---|---|---|
| 2020/0234103 A1 | 7/2020 | Luo et al. | |
| 2020/0314827 A1* | 10/2020 | Ge | G06N 3/084 |
| 2021/0111936 A1* | 4/2021 | Sahin | G06N 3/048 |
| 2021/0241067 A1* | 8/2021 | Nachmani | H03M 13/152 |
| 2022/0416937 A1* | 12/2022 | Andrews | H04B 1/0003 |

OTHER PUBLICATIONS

J. Li and W. Cheng, "Stacked Denoising Autoencoder Enhanced Polar Codes Over Rayleigh Fading Channels," in IEEE Wireless Communications Letters, vol. 9, No. 3, pp. 354-357, Mar. 2020.*

J. Seo, J. Lee and K. Kim, "Decoding of Polar Code by Using Deep Feed-Forward Neural Networks," 2018 International Conference on Computing, Networking and Communications (ICNC), Maui, HI, USA, 2018.*

E. Balevi and J. G. Andrews, "Autoencoder-Based Error Correction Coding for One-Bit Quantization," in IEEE Transactions on Communications, vol. 68, No. 6, pp. 3440-3451, Jun. 2020.*

PCT International Application No. PCT/KR2021/006104, International Search Report dated Aug. 19, 2021, 4 pages.

Seo, Jihoon, et al., "Decoding of Polar Code by Using Deep Feed-Forward Neural Networks", 2018 Workshop on Computing, Networking and Communications (CNC), Mar. 2018, 7 pages.

Doan, Nghia, et al., "Neural Belief Propagation Decoding of CRC-Polar Concatenated Codes", 2019 IEEE International Conference on Communications (ICC), May 2019, 8 pages.

Nokia et al., "Early Hybrid ARQ Feedback for the 5G New Radio," 3GPP TSG-RAN WG1 #87, R1-1612249, Nov. 2016, 9 pages.

* cited by examiner

METHOD AND APPARATUS FOR PERFORMING CHANNEL CODING OF UE AND BASE STATION IN WIRELESS COMMUNICATION SYSTEM

CROSS-REFERENCE TO RELATED APPLICATION(S)

This application is the National Stage filing under 35 U.S.C. 371 of International Application No. PCT/KR2021/006104, filed on May 14, 2021, which claims the benefit of earlier filing date and right of priority to Korean Application No. 10-2020-0127424, filed on Sep. 29, 2020, the contents of which are all incorporated by reference herein in their entirety.

FIELD

The present disclosure relates to a wireless communication system, and more particularly, to a method and apparatus for a terminal and a base station to transmit and receive a signal by performing channel coding in a wireless communication system.

Particularly, a method and apparatus for combining a polar code and a channel coding scheme based on a neural network may be provided for channel coding.

DESCRIPTION OF THE RELATED ART

Radio access systems have come into widespread in order to provide various types of communication services such as voice or data. In general, a radio access system is a multiple access system capable of supporting communication with multiple users by sharing available system resources (bandwidth, transmit power, etc.). Examples of the multiple access system include a code division multiple access (CDMA) system, a frequency division multiple access (FDMA) system, a time division multiple access (TDMA) system, a single carrier-frequency division multiple access (SC-FDMA) system, etc.

In particular, as many communication apparatuses require a large communication capacity, an enhanced mobile broadband (eMBB) communication technology has been proposed compared to radio access technology (RAT). In addition, not only massive machine type communications (MTC) for providing various services anytime anywhere by connecting a plurality of apparatuses and things but also communication systems considering services/user equipments (UEs) sensitive to reliability and latency have been proposed. To this end, various technical configurations have been proposed.

SUMMARY

The present disclosure may provide a method and apparatus for performing channel coding to transmit and receive a signal of a terminal and a base station in a wireless communication system.

The present disclosure may provide a method for a terminal and a base station to perform channel coding based on a polar code and a neural network-based autoencoder and to transmit and receive a signal in a wireless communication system.

The present disclosure may provide a method and apparatus for a receiver to encode a signal based on a polar code and a neural network-based autoencoder in a wireless communication system.

The present disclosure may provide a method and apparatus for a transmitter to decode a signal based on a polar code and a neural network-based autoencoder in a wireless communication system.

Technical objects to be achieved in the present disclosure are not limited to the above-mentioned technical objects, and other technical objects that are not mentioned may be considered by those skilled in the art through the embodiments described below.

In embodiments based on the present disclosure, a method of operating user equipment (UE) in a wireless communication system, the method comprising: identifying layer information that is applied to a neural polar code; generating, based on the identified layer information, transmission data by encoding data that is input into the neural polar code; and transmitting the transmission data to a base station, wherein, based on polar code transformation, the neural polar code generates the transmission data by performing encoding, based on the polar code transformation, from an initial layer of the data to a first layer according to the identified layer information and by performing encoding through a neural network-based autoencoder after the first layer until the transmission data is generated.

In embodiments based on the present disclosure, the autoencoder performs the encoding through training based on the neural network, and wherein as many adjacent bits as a first bit number are input and are encoded in the autoencoder.

In embodiments based on the present disclosure, the first layer where the autoencoder is applied is determined based on the first bit number.

In embodiments based on the present disclosure, data, which is input into the neural polar code, is constructed by a second bit number, and wherein the polar code transformation is applied to bits that are not adjacent, among bits of the data, based on the second bit number from the initial layer of the data to the first layer.

In embodiments based on the present disclosure, an autoencoder is provided as many as the second bit number divided by the first bit number.

In embodiments based on the present disclosure, the UE has only the one autoencoder, and wherein adjacent bits applied to the autoencoder in the first layer are distinguished based on a time division scheme.

In embodiments based on the present disclosure, a first group bit, which is constructed by the first bit number in the first layer by applying the polar code transformation, is encoded through the one autoencoder at a first time, and a second group bit, which is constructed by the first bit number in the first layer by applying the polar code transformation, is encoded through the one autoencoder at a second time.

In embodiments based on the present disclosure, the layer information, which is applied to the neural polar code, is information that is preset in the UE.

In embodiments based on the present disclosure, the UE receives a reference signal from the base station and performs channel measurement, transmit the measured channel information to the base station, and then receives the layer information applied to the neural polar code from the base station through control information.

In embodiments based on the present disclosure based on the layer information indicating that the autoencoder is not applied in every layer, the data is encoded by applying only the polar code transformation and thus the transmission data is generated.

The above-described aspects of the present disclosure are only some of the preferred embodiments of the present disclosure, and various embodiments in which the technical features of the present disclosure are reflected are the detailed descriptions of the present disclosure to be detailed below by those of ordinary skill in the art. It can be derived and understood based on the description.

The following effects may be produced by embodiments based on the present disclosure.

In embodiments based on the present disclosure, a terminal and a base station may perform channel coding to transmit and receive a signal.

Embodiments based on the present disclosure may provide a method of performing channel coding based on a polar code and a neural network-based autoencoder and of transmitting and receiving a signal.

In embodiments based on the present disclosure, a transmitter may encode a signal based on a polar code and a neural network-based autoencoder.

In embodiments based on the present disclosure, a receiver may decode a signal based on a polar code and a neural network-based autoencoder.

Effects obtained in the present disclosure are not limited to the above-mentioned effects, and other effects not mentioned above may be clearly derived and understood by those skilled in the art, to which a technical configuration of the present disclosure is applied, from the following description of embodiments of the present disclosure. That is, effects, which are not intended when implementing a configuration described in the present disclosure, may also be derived by those skilled in the art from the embodiments of the present disclosure.

DESCRIPTION OF DRAWINGS

The accompanying drawings are provided to aid understanding of the present disclosure, and embodiments of the present disclosure may be provided together with a detailed description. However, the technical features of the present disclosure are not limited to a specific drawing, and features disclosed in each drawing may be combined with each other to constitute a new embodiment. Reference numerals in each drawing may mean structural elements.

DETAILED DESCRIPTION

Figure 1:
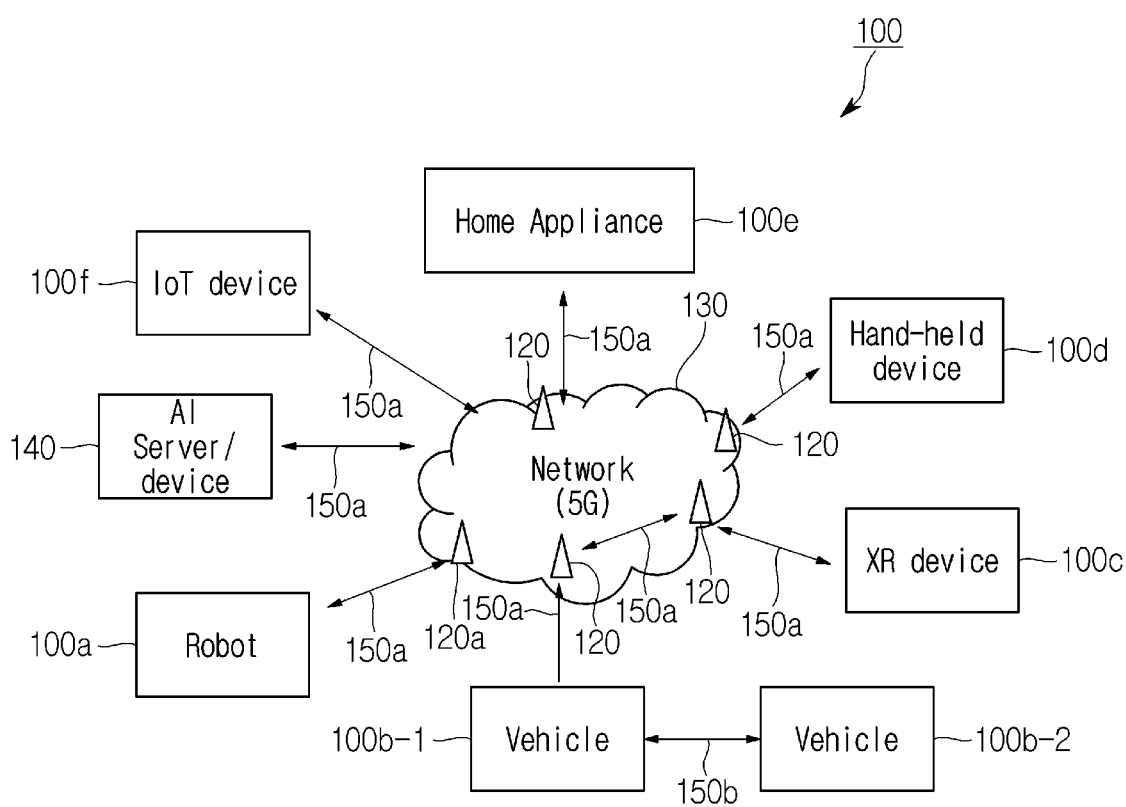
FIG. 1 is a view showing an example of a communication system that is applicable to the present disclosure.

The embodiments of the present disclosure described below are combinations of elements and features of the present disclosure in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present disclosure may be rearranged. Some constructions or elements of any one embodiment may be included in another embodiment and may be replaced with corresponding constructions or features of another embodiment.

In the description of the drawings, procedures or steps which render the scope of the present disclosure unnecessarily ambiguous will be omitted and procedures or steps which can be understood by those skilled in the art will be omitted.

Throughout the specification, when a certain portion "includes" or "comprises" a certain component, this indicates that other components are not excluded and may be further included unless otherwise noted. The terms "unit", "-or/er" and "module" described in the specification indicate a unit for processing at least one function or operation, which may be implemented by hardware, software or a combination thereof. In addition, the terms "a or an", "one", "the" etc. may include a singular representation and a plural representation in the context of the present disclosure (more particularly, in the context of the following claims) unless indicated otherwise in the specification or unless context clearly indicates otherwise.

In the embodiments of the present disclosure, a description is mainly made of a data transmission and reception relationship between a base station (BS) and a mobile station. A BS refers to a terminal node of a network, which directly communicates with a mobile station. A specific operation described as being performed by the BS may be performed by an upper node of the BS.

Namely, it is apparent that, in a network comprised of a plurality of network nodes including a BS, various operations performed for communication with a mobile station may be performed by the BS, or network nodes other than the BS. The term "BS" may be replaced with a fixed station, a Node B, an evolved Node B (eNode B or eNB), an advanced base station (ABS), an access point, etc.

In the embodiments of the present disclosure, the term terminal may be replaced with a UE, a mobile station (MS), a subscriber station (SS), a mobile subscriber station (MSS), a mobile terminal, an advanced mobile station (AMS), etc.

A transmitter is a fixed and/or mobile node that provides a data service or a voice service and a receiver is a fixed and/or mobile node that receives a data service or a voice service. Therefore, a mobile station may serve as a transmitter and a BS may serve as a receiver, on an uplink (UL). Likewise, the mobile station may serve as a receiver and the BS may serve as a transmitter, on a downlink (DL).

The embodiments of the present disclosure may be supported by standard specifications disclosed for at least one of wireless access systems including an Institute of Electrical and Electronics Engineers (IEEE) 802.xx system, a 3rd Generation Partnership Project (3GPP) system, a 3GPP Long Term Evolution (LTE) system, 3GPP 5th generation (5G) new radio (NR) system, and a 3GPP2 system. In particular, the embodiments of the present disclosure may be supported by the standard specifications, 3GPP TS 36.211, 3GPP TS 36.212, 3GPP TS 36.213, 3GPP TS 36.321 and 3GPP TS 36.331.

In addition, the embodiments of the present disclosure are applicable to other radio access systems and are not limited to the above-described system. For example, the embodiments of the present disclosure are applicable to systems applied after a 3GPP 5G NR system and are not limited to a specific system.

That is, steps or parts that are not described to clarify the technical features of the present disclosure may be supported by those documents. Further, all terms as set forth herein may be explained by the standard documents.

Reference will now be made in detail to the embodiments of the present disclosure with reference to the accompanying drawings. The detailed description, which will be given below with reference to the accompanying drawings, is intended to explain exemplary embodiments of the present disclosure, rather than to show the only embodiments that can be implemented according to the disclosure.

The following detailed description includes specific terms in order to provide a thorough understanding of the present disclosure. However, it will be apparent to those skilled in the art that the specific terms may be replaced with other terms without departing the technical spirit and scope of the present disclosure.

The embodiments of the present disclosure can be applied to various radio access systems such as code division multiple access (CDMA), frequency division multiple access (FDMA), time division multiple access (TDMA), orthogonal frequency division multiple access (OFDMA), single carrier frequency division multiple access (SC-FDMA), etc.

Hereinafter, in order to clarify the following description, a description is made based on a 3GPP communication system (e.g., LTE, NR, etc.), but the technical spirit of the present disclosure is not limited thereto. LTE may refer to technology after 3GPP TS 36.xxx Release 8. In detail, LTE technology after 3GPP TS 36.xxx Release 10 may be referred to as LTE-A, and LTE technology after 3GPP TS 36.xxx Release 13 may be referred to as LTE-A pro. 3GPP NR may refer to technology after TS 38.xxx Release 15. 3GPP 6G may refer to technology TS Release 17 and/or Release 18. "xxx" may refer to a detailed number of a standard document. LTE/NR/6G may be collectively referred to as a 3GPP system.

For background arts, terms, abbreviations, etc. used in the present disclosure, refer to matters described in the standard documents published prior to the present disclosure. For example, reference may be made to the standard documents 36.xxx and 38.xxx.

Communication System Applicable to the Present Disclosure

Without being limited thereto, various descriptions, functions, procedures, proposals, methods and/or operational flowcharts of the present disclosure disclosed herein are applicable to various fields requiring wireless communication/connection (e.g., 5G).

Hereinafter, a more detailed description will be given with reference to the drawings. In the following drawings/description, the same reference numerals may exemplify the same or corresponding hardware blocks, software blocks or functional blocks unless indicated otherwise.

FIG. 1 is a view showing an example of a communication system applicable to the present disclosure.

Referring to FIG. 1, the communication system 100 applicable to the present disclosure includes a wireless device, a base station and a network. The wireless device refers to a device for performing communication using radio access technology (e.g., 5G NR or LTE) and may be referred to as a communication/wireless/5G device. Without being limited thereto, the wireless device may include a robot 100a, vehicles 100b-1 and 100b-2, an extended reality (XR) device 100c, a hand-held device 100d, a home appliance 100e, an Internet of Thing (IoT) device 100f, and an artificial intelligence (AI) device/server 100g. For example, the vehicles may include a vehicle having a wireless communication function, an autonomous vehicle, a vehicle capable of performing vehicle-to-vehicle communication, etc. The vehicles 100b-1 and 100b-2 may include an unmanned aerial vehicle (UAV) (e.g., a drone). The XR device 100c includes an augmented reality (AR)/virtual reality (VR)/mixed reality (MR) device and may be implemented in the form of a head-mounted device (HMD), a head-up display (HUD) provided in a vehicle, a television, a smartphone, a computer, a wearable device, a home appliance, a digital signage, a vehicle or a robot. The hand-held device 100d may include a smartphone, a smart pad, a wearable device (e.g., a smart watch or smart glasses), a computer (e.g., a laptop), etc. The home appliance 100e may include a TV, a refrigerator, a washing machine, etc. The IoT device 100f may include a sensor, a smart meter, etc. For example, the base station 120 and the network 130 may be implemented by a wireless device, and a specific wireless device 120a may operate as a base station/network node for another wireless device.

The wireless devices 100a to 100f may be connected to the network 130 through the base station 120. AI technology is applicable to the wireless devices 100a to 100f, and the wireless devices 100a to 100f may be connected to the AI server 100g through the network 130. The network 130 may be configured using a 3G network, a 4G (e.g., LTE) network or a 5G (e.g., NR) network, etc. The wireless devices 100a to 100f may communicate with each other through the base station 120/the network 130 or perform direct communication (e.g., sidelink communication) without through the base station 120/the network 130. For example, the vehicles 100b-1 and 100b-2 may perform direct communication (e.g., vehicle to vehicle (V2V)/vehicle to everything (V2X) communication). In addition, the IoT device 100f (e.g., a sensor) may perform direct communication with another IoT device (e.g., a sensor) or the other wireless devices 100a to 100f.

Wireless communications/connections 150a, 150b and 150c may be established between the wireless devices 100a to 100f/the base station 120 and the base station 120/the base station 120. Here, wireless communication/connection may be established through various radio access technologies (e.g., 5G NR) such as uplink/downlink communication 150a, sidelink communication 150b (or D2D communication) or communication 150c between base stations (e.g., relay, integrated access backhaul (IAB). The wireless device and the base station/wireless device or the base station and the base station may transmit/receive radio signals to/from each other through wireless communication/connection 150a, 150b and 150c. For example, wireless communication/connection 150a, 150b and 150c may enable signal transmission/reception through various physical channels. To this end, based on the various proposals of the present disclosure, at least some of various configuration information setting processes for transmission/reception of radio signals, various signal processing procedures (e.g., channel encoding/decoding, modulation/demodulation, resource mapping/demapping, etc.), resource allocation processes, etc. may be performed.

Communication System Applicable to the Present Disclosure

Figure 2:
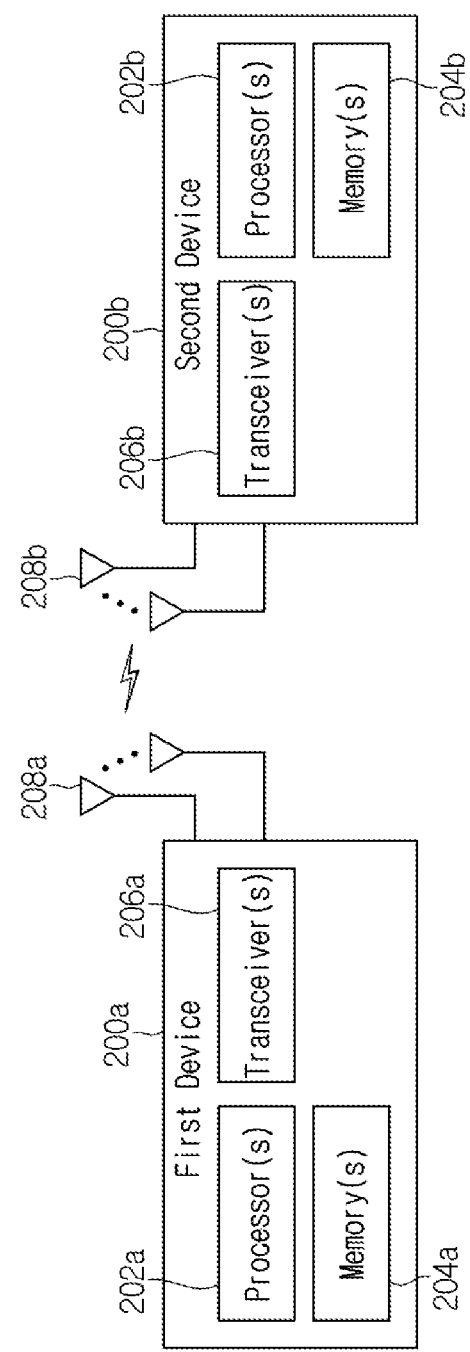
FIG. 2 is a view showing an example of a wireless device that is applicable to the present disclosure.

FIG. 2 is a view showing an example of a wireless device applicable to the present disclosure.

Referring to FIG. 2, a first wireless device 200a and a second wireless device 200b may transmit and receive radio signals through various radio access technologies (e.g., LTE or NR). Here, {the first wireless device 200a, the second wireless device 200b} may correspond to {the wireless device 100x, the base station 120} and/or {the wireless device 100x, the wireless device 100x} of FIG. 1.

The first wireless device 200a may include one or more processors 202a and one or more memories 204a and may further include one or more transceivers 206a and/or one or more antennas 208a. The processor 202a may be configured to control the memory 204a and/or the transceiver 206a and to implement descriptions, functions, procedures, proposals, methods and/or operational flowcharts disclosed herein. For example, the processor 202a may process information in the memory 204a to generate first information/signal and then transmit a radio signal including the first information/signal through the transceiver 206a. In addition, the processor 202a may receive a radio signal including second information/signal through the transceiver 206a and then store information obtained from signal processing of the second information/signal in the memory 204a. The memory 204a may be coupled with the processor 202a, and store a variety of information related to operation of the processor 202a. For example, the memory 204a may store software code including instructions for performing all or some of the processes controlled by the processor 202a or performing the descriptions, functions, procedures, proposals, methods and/or operational flowcharts disclosed herein. Here, the processor 202a and the memory 204a may be part of a communication modem/circuit/chip designed to implement wireless communication technology (e.g., LTE or NR). The transceiver 206a may be coupled with the processor 202a to transmit and/or receive radio signals through one or more antennas 208a. The transceiver 206a may include a transmitter and/or a receiver. The transceiver 206a may be used interchangeably with a radio frequency (RF) unit. In the present disclosure, the wireless device may refer to a communication modem/circuit/chip.

The second wireless device 200b may include one or more processors 202b and one or more memories 204b and may further include one or more transceivers 206b and/or one or more antennas 208b. The processor 202b may be configured to control the memory 204b and/or the transceiver 206b and to implement the descriptions, functions, procedures, proposals, methods and/or operational flowcharts disclosed herein. For example, the processor 202b may process information in the memory 204b to generate third information/signal and then transmit the third information/signal through the transceiver 206b. In addition, the processor 202b may receive a radio signal including fourth information/signal through the transceiver 206b and then store information obtained from signal processing of the fourth information/signal in the memory 204b. The memory 204b may be coupled with the processor 202b to store a variety of information related to operation of the processor 202b. For example, the memory 204b may store software code including instructions for performing all or some of the processes controlled by the processor 202b or performing the descriptions, functions, procedures, proposals, methods and/or operational flowcharts disclosed herein. Herein, the processor 202b and the memory 204b may be part of a communication modem/circuit/chip designed to implement wireless communication technology (e.g., LTE or NR). The transceiver 206b may be coupled with the processor 202b to transmit and/or receive radio signals through one or more antennas 208b. The transceiver 206b may include a transmitter and/or a receiver. The transceiver 206b may be used interchangeably with a radio frequency (RF) unit. In the present disclosure, the wireless device may refer to a communication modem/circuit/chip.

Hereinafter, hardware elements of the wireless devices 200a and 200b will be described in greater detail. Without being limited thereto, one or more protocol layers may be implemented by one or more processors 202a and 202b. For example, one or more processors 202a and 202b may implement one or more layers (e.g., functional layers such as PHY (physical), MAC (media access control), RLC (radio link control), PDCP (packet data convergence protocol), RRC (radio resource control), SDAP (service data adaptation protocol)). One or more processors 202a and 202b may generate one or more protocol data units (PDUs) and/or one or more service data unit (SDU) according to the descriptions, functions, procedures, proposals, methods and/or operational flowcharts disclosed herein. One or more processors 202a and 202b may generate messages, control information, data or information according to the descriptions, functions, procedures, proposals, methods and/or operational flowcharts disclosed herein. One or more processors 202a and 202b may generate PDUs, SDUs, messages, control information, data or information according to the functions, procedures, proposals and/or methods disclosed herein and provide the PDUs, SDUs, messages, control information, data or information to one or more transceivers 206a and 206b. One or more processors 202a and 202b may receive signals (e.g., baseband signals) from one or more transceivers 206a and 206b and acquire PDUs, SDUs, messages, control information, data or information according to the descriptions, functions, procedures, proposals, methods and/or operational flowcharts disclosed herein.

One or more processors 202a and 202b may be referred to as controllers, microcontrollers, microprocessors or microcomputers. One or more processors 202a and 202b may be implemented by hardware, firmware, software or a combination thereof. For example, one or more application specific integrated circuits (ASICs), one or more digital signal processors (DSPs), one or more digital signal processing devices (DSPDs), programmable logic devices (PLDs) or one or more field programmable gate arrays (FPGAs) may be included in one or more processors 202a and 202b. The descriptions, functions, procedures, proposals, methods and/or operational flowcharts disclosed herein may be implemented using firmware or software, and firmware or software may be implemented to include modules, procedures, functions, etc. Firmware or software configured to perform the descriptions, functions, procedures, proposals, methods and/or operational flowcharts disclosed herein may be included in one or more processors 202a and 202b or stored in one or more memories 204a and 204b to be driven by one or more processors 202a and 202b. The descriptions, functions, procedures, proposals, methods and/or operational flowcharts disclosed herein implemented using firmware or software in the form of code, a command and/or a set of commands.

One or more memories 204a and 204b may be coupled with one or more processors 202a and 202b to store various types of data, signals, messages, information, programs, code, instructions and/or commands. One or more memories 204a and 204b may be composed of read only memories (ROMs), random access memories (RAMs), erasable programmable read only memories (EPROMs), flash memories, hard drives, registers, cache memories, computer-readable storage mediums and/or combinations thereof. One or more memories 204a and 204b may be located inside and/or outside one or more processors 202a and 202b. In addition, one or more memories 204a and 204b may be coupled with one or more processors 202a and 202b through various technologies such as wired or wireless connection.

One or more transceivers 206a and 206b may transmit user data, control information, radio signals/channels, etc. described in the methods and/or operational flowcharts of the present disclosure to one or more other apparatuses. One or more transceivers 206a and 206b may receive user data, control information, radio signals/channels, etc. described in the methods and/or operational flowcharts of the present disclosure from one or more other apparatuses. For example, one or more transceivers 206a and 206b may be coupled with one or more processors 202a and 202b to transmit/ receive radio signals. For example, one or more processors 202a and 202b may perform control such that one or more transceivers 206a and 206b transmit user data, control information or radio signals to one or more other apparatuses. In addition, one or more processors 202a and 202b may perform control such that one or more transceivers 206a and 206b receive user data, control information or radio signals from one or more other apparatuses. In addition, one or more transceivers 206a and 206b may be coupled with one or more antennas 208a and 208b, and one or more transceivers 206a and 206b may be configured to transmit/receive user data, control information, radio signals/channels, etc. described in the descriptions, functions, procedures, proposals, methods and/or operational flowcharts disclosed herein through one or more antennas 208a and 208b. In the present disclosure, one or more antennas may be a plurality of physical antennas or a plurality of logical antennas (e.g., antenna ports). One or more transceivers 206a and 206b may convert the received radio signals/channels, etc. from RF band signals to baseband signals, in order to process the received user data, control information, radio signals/channels, etc. using one or more processors 202a and 202b. One or more transceivers 206a and 206b may convert the user data, control information, radio signals/channels processed using one or more processors 202a and 202b from baseband signals into RF band signals. To this end, one or more transceivers 206a and 206b may include (analog) oscillator and/or filters.

Structure of Wireless Device Applicable to the Present Disclosure

Figure 3:
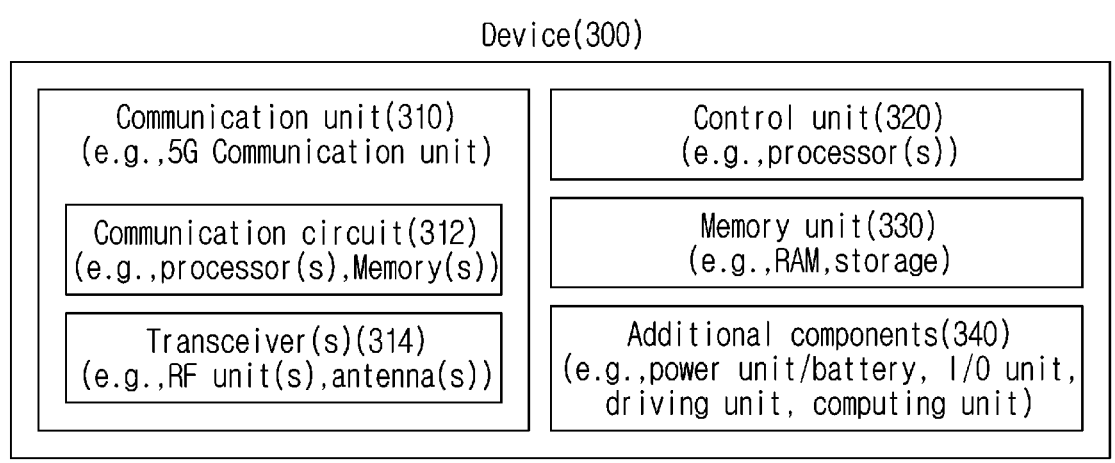
FIG. 3 is a view showing another example of a wireless device that is applicable to the present disclosure.

FIG. 3 is a view showing another example of a wireless device applicable to the present disclosure.

Referring to FIG. 3, a wireless device 300 may correspond to the wireless devices 200a and 200b of FIG. 2 and include various elements, components, units/portions and/or modules. For example, the wireless device 300 may include a communication unit 310, a control unit (controller) 320, a memory unit (memory) 330 and additional components 340. The communication unit may include a communication circuit 312 and a transceiver(s) 314. For example, the communication circuit 312 may include one or more processors 202a and 202b and/or one or more memories 204a and 204b of FIG. 2. For example, the transceiver(s) 314 may include one or more transceivers 206a and 206b and/or one or more antennas 208a and 208b of FIG. 2. The control unit 320 may be electrically coupled with the communication unit 310, the memory unit 330 and the additional components 340 to control overall operation of the wireless device. For example, the control unit 320 may control electrical/mechanical operation of the wireless device based on a program/code/instruction/information stored in the memory unit 330. In addition, the control unit 320 may transmit the information stored in the memory unit 330 to the outside (e.g., another communication device) through the wireless/wired interface using the communication unit 310 over a wireless/wired interface or store information received from the outside (e.g., another communication device) through the wireless/wired interface using the communication unit 310 in the memory unit 330.

The additional components 340 may be variously configured according to the types of the wireless devices. For example, the additional components 340 may include at least one of a power unit/battery, an input/output unit, a driving unit or a computing unit. Without being limited thereto, the wireless device 300 may be implemented in the form of the robot (FIG. 1, 100a), the vehicles (FIGS. 1, 100b-1 and 100b-2), the XR device (FIG. 1, 100c), the hand-held device (FIG. 1, 100d), the home appliance (FIG. 1, 100e), the IoT device (FIG. 1, 100f), a digital broadcast terminal, a hologram apparatus, a public safety apparatus, an MTC apparatus, a medical apparatus, a Fintech device (financial device), a security device, a climate/environment device, an AI server/device (FIG. 1, 140), the base station (FIG. 1, 120), a network node, etc. The wireless device may be movable or may be used at a fixed place according to use example/service.

In FIG. 3, various elements, components, units/portions and/or modules in the wireless device 300 may be coupled with each other through wired interfaces or at least some thereof may be wirelessly coupled through the communication unit 310. For example, in the wireless device 300, the control unit 320 and the communication unit 310 may be coupled by wire, and the control unit 320 and the first unit (e.g., 130 or 140) may be wirelessly coupled through the communication unit 310. In addition, each element, component, unit/portion and/or module of the wireless device 300 may further include one or more elements. For example, the control unit 320 may be composed of a set of one or more processors. For example, the control unit 320 may be composed of a set of a communication control processor, an application processor, an electronic control unit (ECU), a graphic processing processor, a memory control processor, etc. In another example, the memory unit 330 may be composed of a random access memory (RAM), a dynamic RAM (DRAM), a read only memory (ROM), a flash memory, a volatile memory, a non-volatile memory and/or a combination thereof Hand-Held Device Applicable to the Present Disclosure FIG. 4 is a view showing an example of a hand-held device applicable to the present disclosure.

Figure 4:
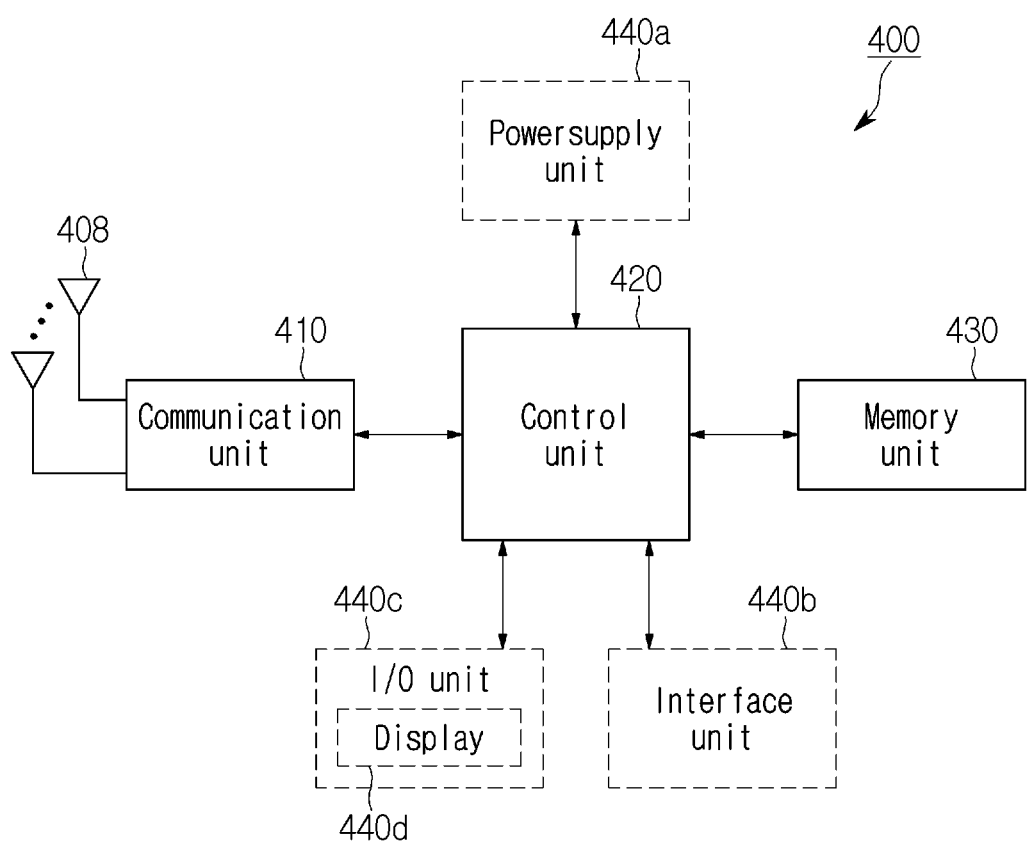
FIG. 4 is a view showing an example of a hand-held device that is applicable to the present disclosure.

FIG. 4 shows a hand-held device applicable to the present disclosure. The hand-held device may include a smartphone, a smart pad, a wearable device (e.g., a smart watch or smart glasses), and a hand-held computer (e.g., a laptop, etc.). The hand-held device may be referred to as a mobile station (MS), a user terminal (UT), a mobile subscriber station (MSS), a subscriber station (SS), an advanced mobile station (AMS) or a wireless terminal (WT).

Referring to FIG. 4, the hand-held device 400 may include an antenna unit (antenna) 408, a communication unit (transceiver) 410, a control unit (controller) 420, a memory unit (memory) 430, a power supply unit (power supply) 440a, an interface unit (interface) 440b, and an input/output unit 440c. An antenna unit (antenna) 408 may be part of the communication unit 410. The blocks 410 to 430/440a to 440c may correspond to the blocks 310 to 330/340 of FIG. 3, respectively.

The communication unit 410 may transmit and receive signals (e.g., data, control signals, etc.) to and from other wireless devices or base stations. The control unit 420 may control the components of the hand-held device 400 to perform various operations. The control unit 420 may include an application processor (AP). The memory unit 430 may store data/parameters/program/code/instructions necessary to drive the hand-held device 400. In addition, the memory unit 430 may store input/output data/information, etc. The power supply unit 440a may supply power to the hand-held device 400 and include a wired/wireless charging circuit, a battery, etc. The interface unit 440b may support connection between the hand-held device 400 and another external device. The interface unit 440b may include various ports (e.g., an audio input/output port and a video input/output port) for connection with the external device. The input/output unit 440c may receive or output video information/signals, audio information/signals, data and/or user input information. The input/output unit 440c may include a camera, a microphone, a user input unit, a display 440d, a speaker and/or a haptic module.

For example, in case of data communication, the input/output unit 440c may acquire user input information/signal (e.g., touch, text, voice, image or video) from the user and store the user input information/signal in the memory unit 430. The communication unit 410 may convert the information/signal stored in the memory into a radio signal and transmit the converted radio signal to another wireless device directly or transmit the converted radio signal to a base station. In addition, the communication unit 410 may receive a radio signal from another wireless device or the base station and then restore the received radio signal into original information/signal. The restored information/signal may be stored in the memory unit 430 and then output through the input/output unit 440c in various forms (e.g., text, voice, image, video and haptic).

Type of Wireless Device Applicable to the Present Disclosure

Figure 5:
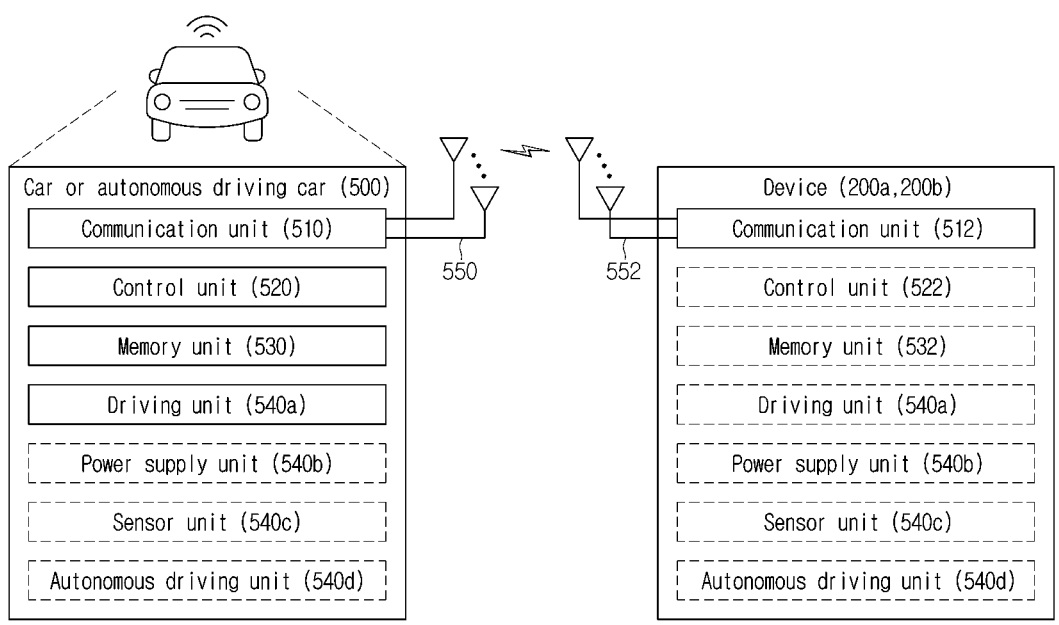
FIG. 5 is a view showing an example of a vehicle or an autonomous vehicle that is applicable to the present disclosure.

FIG. 5 is a view showing an example of a car or an autonomous driving car applicable to the present disclosure.

FIG. 5 shows a car or an autonomous driving vehicle applicable to the present disclosure. The car or the autonomous driving car may be implemented as a mobile robot, a vehicle, a train, a manned/unmanned aerial vehicle (AV), a ship, etc. and the type of the car is not limited.

Referring to FIG. 5, the car or autonomous driving car 500 may include an antenna unit (antenna) 508, a communication unit (transceiver) 510, a control unit (controller) 520, a driving unit 540a, a power supply unit (power supply) 540b, a sensor unit 540c, and an autonomous driving unit 540d. The antenna unit 550 may be configured as part of the communication unit 510. The blocks 510/530/540a to 540d correspond to the blocks 410/430/440 of FIG. 4.

The communication unit 510 may transmit and receive signals (e.g., data, control signals, etc.) to and from external devices such as another vehicle, a base station (e.g., a base station, a road side unit, etc.), and a server. The control unit 520 may control the elements of the car or autonomous driving car 500 to perform various operations. The control unit 520 may include an electronic control unit (ECU).

Figure 6:
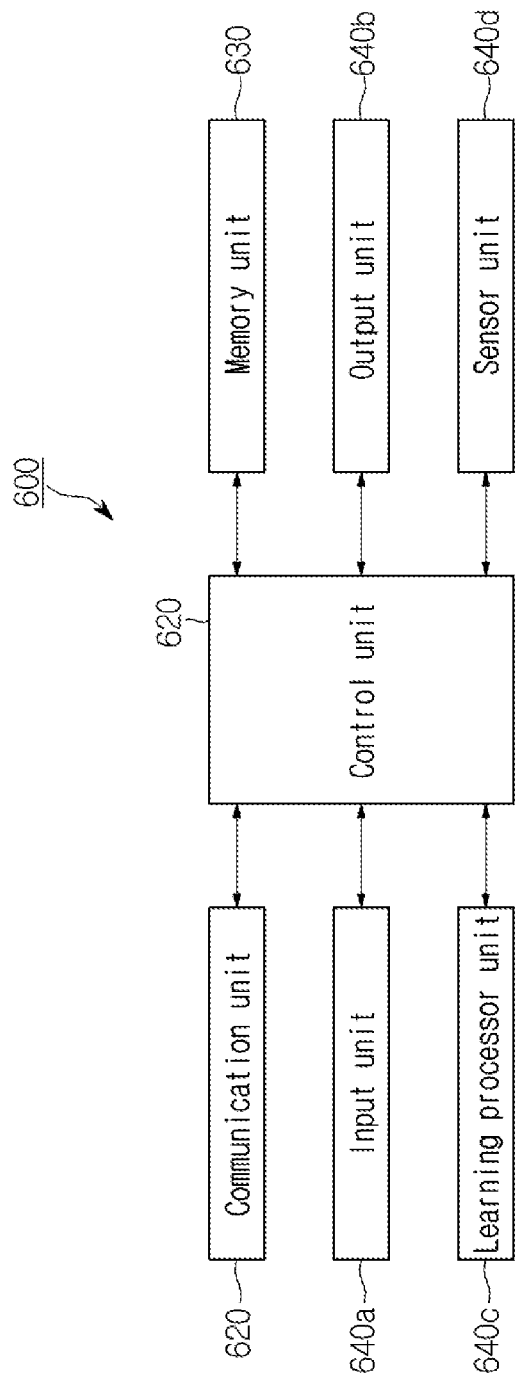
FIG. 6 is a view showing an example of artificial intelligence (AI) that is applicable to the present disclosure.

FIG. 6 is a view showing an example of artificial intelligence (AI) device applicable to the present disclosure. For example, the AI device may be implemented as fixed or movable devices such as a TV, a projector, a smartphone, a PC, a laptop, a digital broadcast terminal, a tablet PC, a wearable device, a set-top box (STB), a radio, a washing machine, a refrigerator, a digital signage, a robot, a vehicle, or the like.

Referring to FIG. 6, the AI device 900 may include a communication unit (transceiver) 910, a control unit (controller) 920, a memory unit (memory) 930, an input/output unit 940a/940b, a leaning processor unit (learning processor) 940c and a sensor unit 940d. The blocks 910 to 930/940a to 940d may correspond to the blocks 310 to 330/340 of FIG. 3, respectively.

The communication unit 910 may transmit and receive wired/wireless signals (e.g., sensor information, user input, learning models, control signals, etc.) to and from external devices such as another AI device (e.g., FIG. 1, 100x, 120 or 140) or the AI server (FIG. 1, 140) using wired/wireless communication technology. To this end, the communication unit 910 may transmit information in the memory unit 930 to an external device or transfer a signal received from the external device to the memory unit 930.

The control unit 920 may determine at least one executable operation of the AI device 900 based on information determined or generated using a data analysis algorithm or a machine learning algorithm. In addition, the control unit 920 may control the components of the AI device 900 to perform the determined operation. For example, the control unit 920 may request, search for, receive or utilize the data of the learning processor unit 940c or the memory unit 930, and control the components of the AI device 900 to perform predicted operation or operation, which is determined to be desirable, of at least one executable operation. In addition, the control unit 920 may collect history information including operation of the AI device 900 or user's feedback on the operation and store the history information in the memory unit 930 or the learning processor unit 940c or transmit the history information to the AI server (FIG. 1, 140). The collected history information may be used to update a learning model.

The memory unit 930 may store data supporting various functions of the AI device 900. For example, the memory unit 930 may store data obtained from the input unit 940a, data obtained from the communication unit 910, output data of the learning processor unit 940c, and data obtained from the sensing unit 940. In addition, the memory unit 930 may store control information and/or software code necessary to operate/execute the control unit 920.

The input unit 940a may acquire various types of data from the outside of the AI device 900. For example, the input unit 940a may acquire learning data for model learning, input data, to which the learning model will be applied, etc. The input unit 940a may include a camera, a microphone and/or a user input unit. The output unit 940b may generate video, audio or tactile output. The output unit 940b may include a display, a speaker and/or a haptic module. The sensing unit 940 may obtain at least one of internal information of the AI device 900, the surrounding environment information of the AI device 900 and user information using various sensors. The sensing unit 940 may include a proximity sensor, an illumination sensor, an acceleration sensor, a magnetic sensor, a gyro sensor, an inertia sensor, a red green blue (RGB) sensor, an infrared (IR) sensor, a finger scan sensor, an ultrasonic sensor, an optical sensor, a microphone and/or a radar.

The learning processor unit 940c may train a model composed of an artificial neural network using training data. The learning processor unit 940c may perform AI processing along with the learning processor unit of the AI server (FIG. 1, 140). The learning processor unit 940c may process information received from an external device through the communication unit 910 and/or information stored in the memory unit 930. In addition, the output value of the learning processor unit 940c may be transmitted to the external device through the communication unit 910 and/or stored in the memory unit 930.

Figure 7:
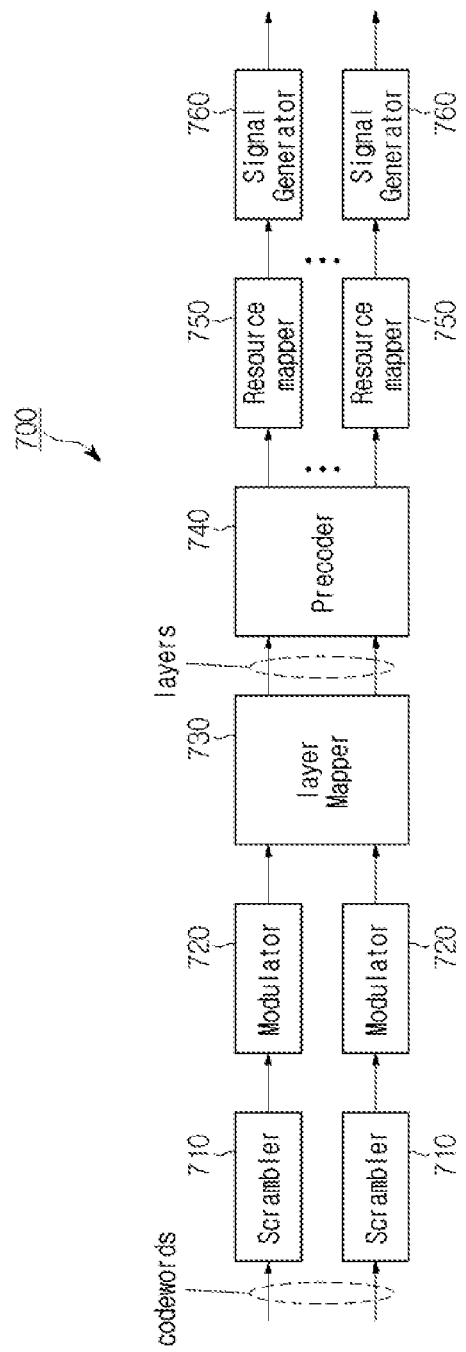
FIG. 7 is a view showing a method of processing a transmission signal that is applicable to the present disclosure.
Figure 8:
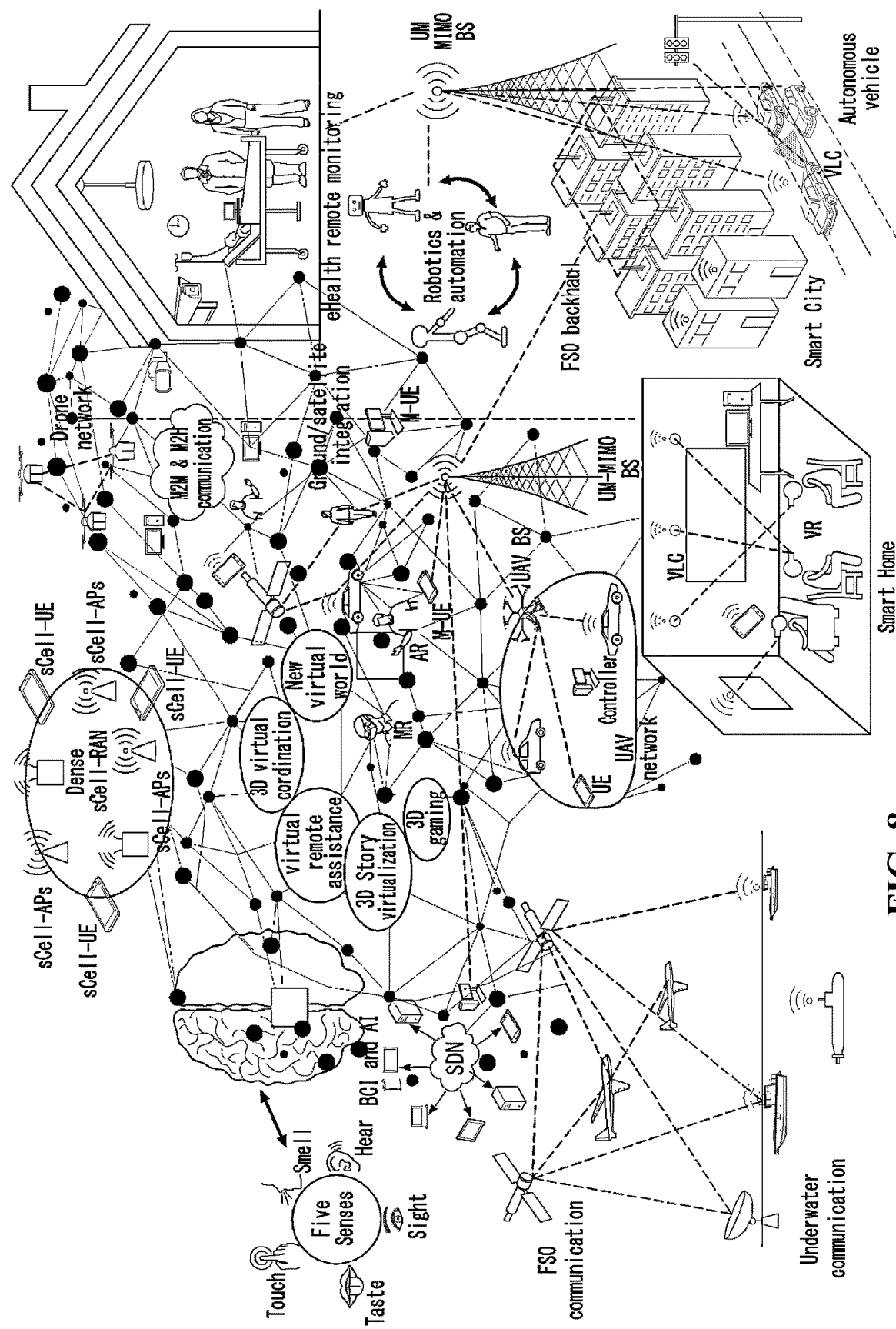
FIG. 8 is a view showing an example of a communication architecture that can be provided in a 6G system applicable to the present disclosure.
Figure 9:
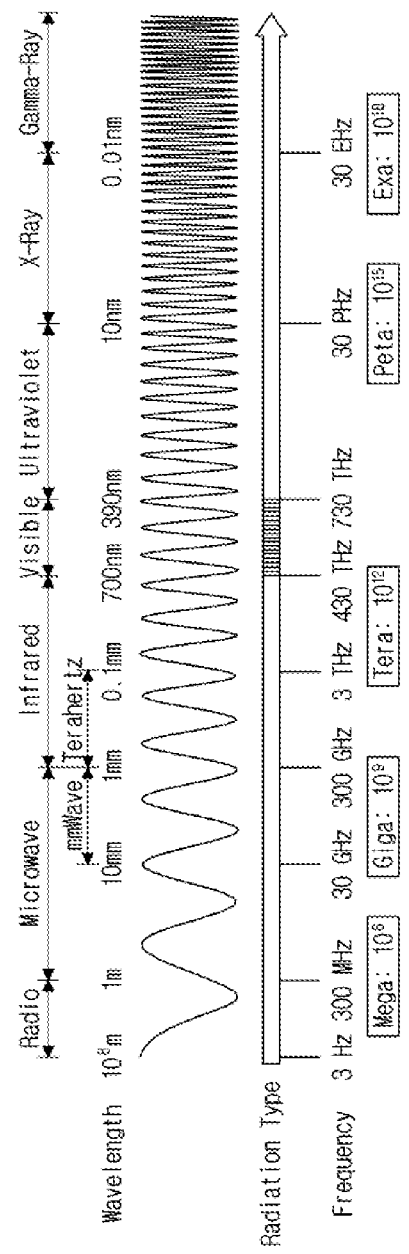
FIG. 9 is a view showing an electromagnetic spectrum that is applicable to the present disclosure.

FIG. 7 is a view showing a method of processing a transmitted signal applicable to the present disclosure. For example, the transmitted signal may be processed by a signal processing circuit. At this time, a signal processing circuit 1200 may include a scrambler 1210, a modulator 1220, a layer mapper 1230, a precoder 1240, a resource mapper 1250, and a signal generator 1260. At this time, for example, the operation/function of FIG. 12 may be performed by the processors 202a and 202b and/or the transceiver 206a and 206b of FIG. 2. In addition, for example, the hardware element of FIG. 7 may be implemented in the processors 202a and 202b of FIG. 2 and/or the transceivers 206a and 206b of FIG. 2. For example, blocks 1010 to 1060 may be implemented in the processors 202a and 202b of FIG. 2. In addition, blocks 1210 to 1250 may be implemented in the processors 202a and 202b of FIG. 2 and a block 1260 may be implemented in the transceivers 206a and 206b of FIG. 2, without being limited to the above-described embodiments.

A codeword may be converted into a radio signal through the signal processing circuit 1200 of FIG. 7. Here, the codeword is a coded bit sequence of an information block. The information block may include a transport block (e.g., a UL-SCH transport block or a DL-SCH transport block). The radio signal may be transmitted through various physical channels (e.g., a PUSCH and a PDSCH). Specifically, the codeword may be converted into a bit sequence scrambled by the scrambler 1210. The scramble sequence used for scramble is generated based in an initial value and the initial value may include ID information of a wireless device, etc. The scrambled bit sequence may be modulated into a modulated symbol sequence by the modulator 1220. The modulation method may include pi/2-binary phase shift keying (pi/2-BPSK), m-phase shift keying (m-PSK), m-quadrature amplitude modulation (m-QAM), etc.

A complex modulation symbol sequence may be mapped to one or more transport layer by the layer mapper 1230. Modulation symbols of each transport layer may be mapped to corresponding antenna port(s) by the precoder 1240 (precoding). The output z of the precoder 1240 may be obtained by multiplying the output y of the layer mapper 1230 by an N*M precoding matrix W. Here, N may be the number of antenna ports and M may be the number of transport layers. Here, the precoder 1240 may perform precoding after transform precoding (e.g., discrete Fourier transform (DFT)) for complex modulation symbols. In addition, the precoder 1240 may perform precoding without performing transform precoding.

The resource mapper 1250 may map modulation symbols of each antenna port to time-frequency resources. The time-frequency resources may include a plurality of symbols (e.g., a CP-OFDMA symbol and a DFT-s-OFDMA symbol) in the time domain and include a plurality of subcarriers in the frequency domain. The signal generator 1260 may generate a radio signal from the mapped modulation symbols, and the generated radio signal may be transmitted to another device through each antenna. To this end, the signal generator 1260 may include an inverse fast Fourier transform (IFFT) module, a cyclic prefix (CP) insertor, a digital-to-analog converter (DAC), a frequency uplink converter, etc.

A signal processing procedure for a received signal in the wireless device may be configured as the inverse of the signal processing procedures 1210 to 1260 of FIG. 7. For example, the wireless device (e.g., 200a or 200b of FIG. 2) may receive a radio signal from the outside through an antenna port/transceiver. The received radio signal may be converted into a baseband signal through a signal restorer. To this end, the signal restorer may include a frequency downlink converter, an analog-to-digital converter (ADC), a CP remover, and a fast Fourier transform (FFT) module. Thereafter, the baseband signal may be restored to a codeword through a resource de-mapper process, a postcoding process, a demodulation process and a de-scrambling process. The codeword may be restored to an original information block through decoding. Accordingly, a signal processing circuit (not shown) for a received signal may include a signal restorer, a resource de-mapper, a postcoder, a demodulator, a de-scrambler and a decoder.

6G Communication System 6G (radio communications) systems are characterized by (i) very high data rates per device, (ii) very large number of connected devices, (iii) global connectivity, (iv) very low latency, (v) battery—It aims to lower energy consumption of battery-free IoT devices, (vi) ultra-reliable connectivity, and (vii) connected intelligence with machine learning capabilities. The vision of the 6G system can be four aspects such as "intelligent connectivity", "deep connectivity", "holographic connectivity", and "ubiquitous connectivity", and the 6G system can satisfy the requirements shown in Table 1 below. That is, Table 1 is a table showing the requirements of the 6G system.

TABLE 1

| Per device peak data rate | 1 Tbps |
|---|---|
| E2E latency | 1 ms |
| Maximum spectral efficiency | 100 bps/Hz |
| Mobility support | Up to 1000 km/hr |
| Satellite integration | Fully |
| AI | Fully |
| Autonomous vehicle | Fully |
| XR | Fully |
| Haptic Communication | Fully |

At this time, the 6G system is enhanced mobile broadband (eMBB), ultra-reliable low latency communications (URLLC), mMTC (massive machine type communications), AI integrated communication, tactile tactile internet, high throughput, high network capacity, high energy efficiency, low backhaul and access network congestion and improved data security (can have key factors such as enhanced data security.

Figure 10:
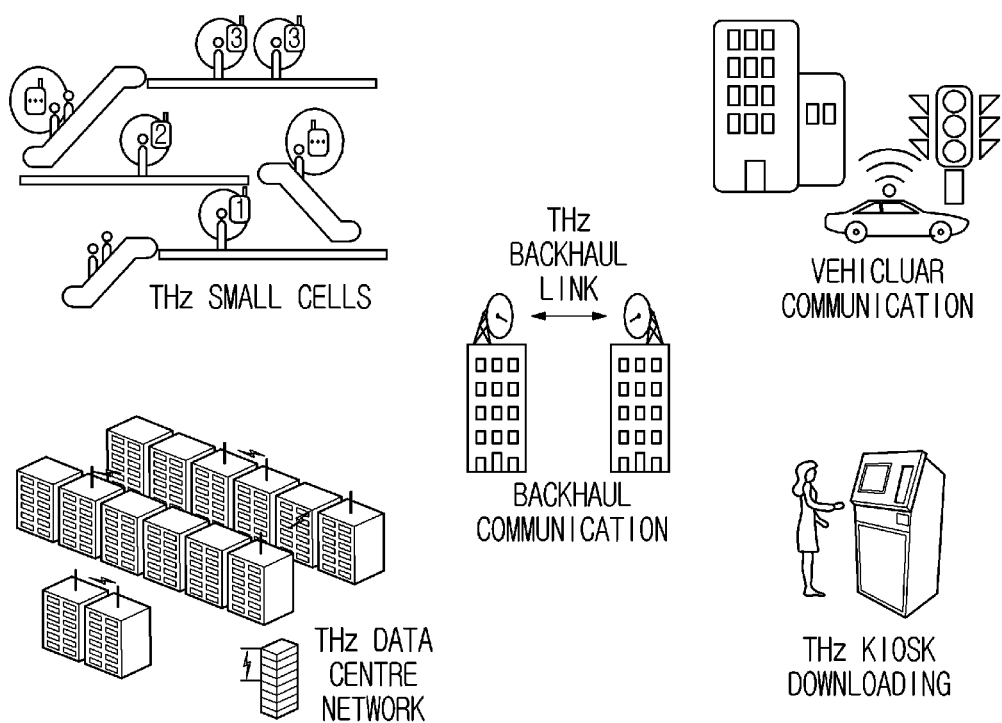
FIG. 10 is a view showing a THz communication method that is applicable to the present disclosure.

FIG. 10 is a view showing an example of a communication structure providable in a 6G system applicable to the present disclosure.

Referring to FIG. 10, the 6G system will have 50 times higher simultaneous wireless communication connectivity than a 5G wireless communication system. URLLC, which is the key feature of 5G, will become more important technology by providing end-to-end latency less than 1 ms in 6G communication. At this time, the 6G system may have much better volumetric spectrum efficiency unlike frequently used domain spectrum efficiency. The 6G system may provide advanced battery technology for energy harvesting and very long battery life and thus mobile devices may not need to be separately charged in the 6G system. In addition, in 6G, new network characteristics may be as follows.

Core Implementation Technology of 6G System
Artificial Intelligence (AI)

Technology which is most important in the 6G system and will be newly introduced is AI. AI was not involved in the 4G system. A 5G system will support partial or very limited AI. However, the 6G system will support AI for full automation. Advance in machine learning will create a more intelligent network for real-time communication in 6G. When AI is introduced to communication, real-time data transmission may be simplified and improved. AI may determine a method of performing complicated target tasks using countless analysis. That is, AI may increase efficiency and reduce processing delay.

Time-consuming tasks such as handover, network selection or resource scheduling may be immediately performed by using AI. AI may play an important role even in M2M, machine-to-human and human-to-machine communication. In addition, AI may be rapid communication in a brain computer interface (BCI). An AI based communication system may be supported by meta materials, intelligent structures, intelligent networks, intelligent devices, intelligent recognition radios, self-maintaining wireless networks and machine learning.

Recently, attempts have been made to integrate AI with a wireless communication system in the application layer or the network layer, but deep learning have been focused on the wireless resource management and allocation field. However, such studies are gradually developed to the MAC layer and the physical layer, and, particularly, attempts to combine deep learning in the physical layer with wireless transmission are emerging. AI-based physical layer transmission means applying a signal processing and communication mechanism based on an AI driver rather than a traditional communication framework in a fundamental signal processing and communication mechanism. For example, channel coding and decoding based on deep learning, signal estimation and detection based on deep learning, multiple input multiple output (MIMO) mechanisms based on deep learning, resource scheduling and allocation based on AI, etc. may be included.

Machine learning may be used for channel estimation and channel tracking and may be used for power allocation, interference cancellation, etc. in the physical layer of DL. In addition, machine learning may be used for antenna selection, power control, symbol detection, etc. in the MIMO system.

However, application of a deep neutral network (DNN) for transmission in the physical layer may have the following problems.

Deep learning-based AI algorithms require a lot of training data in order to optimize training parameters. However, due to limitations in acquiring data in a specific channel environment as training data, a lot of training data is used offline. Static training for training data in a specific channel environment may cause a contradiction between the diversity and dynamic characteristics of a radio channel.

In addition, currently, deep learning mainly targets real signals. However, the signals of the physical layer of wireless communication are complex signals. For matching of the characteristics of a wireless communication signal, studies on a neural network for detecting a complex domain signal are further required.

Hereinafter, machine learning will be described in greater detail.

Machine learning refers to a series of operations to train a machine in order to build a machine which can perform tasks which cannot be performed or are difficult to be performed by people. Machine learning requires data and learning models. In machine learning, data learning methods may be roughly divided into three methods, that is, supervised learning, unsupervised learning and reinforcement learning.

Neural network learning is to minimize output error. Neural network learning refers to a process of repeatedly inputting training data to a neural network, calculating the error of the output and target of the neural network for the training data, backpropagating the error of the neural network from the output layer of the neural network to an input layer in order to reduce the error and updating the weight of each node of the neural network.

Supervised learning may use training data labeled with a correct answer and the unsupervised learning may use training data which is not labeled with a correct answer. That is, for example, in case of supervised learning for data classification, training data may be labeled with a category.

The labeled training data may be input to the neural network, and the output (category) of the neural network may be compared with the label of the training data, thereby calculating the error. The calculated error is backpropagated from the neural network backward (that is, from the output layer to the input layer), and the connection weight of each node of each layer of the neural network may be updated according to backpropagation. Change in updated connection weight of each node may be determined according to the learning rate. Calculation of the neural network for input data and backpropagation of the error may configure a learning cycle (epoch). The learning data is differently applicable according to the number of repetitions of the learning cycle of the neural network. For example, in the early phase of learning of the neural network, a high learning rate may be used to increase efficiency such that the neural network rapidly ensures a certain level of performance and, in the late phase of learning, a low learning rate may be used to increase accuracy.

The learning method may vary according to the feature of data. For example, for the purpose of accurately predicting data transmitted from a transmitter in a receiver in a communication system, learning may be performed using supervised learning rather than unsupervised learning or reinforcement learning.

The learning model corresponds to the human brain and may be regarded as the most basic linear model. However, a paradigm of machine learning using a neural network structure having high complexity, such as artificial neural networks, as a learning model is referred to as deep learning.

Neural network cores used as a learning method may roughly include a deep neural network (DNN) method, a convolutional deep neural network (CNN) method and a recurrent Boltzmman machine (RNN) method. Such a learning model is applicable.

Terahertz (THz) Communication

THz communication is applicable to the 6G system. For example, a data rate may increase by increasing bandwidth. This may be performed by using sub-THz communication with wide bandwidth and applying advanced massive MIMO technology.

Figure 11:
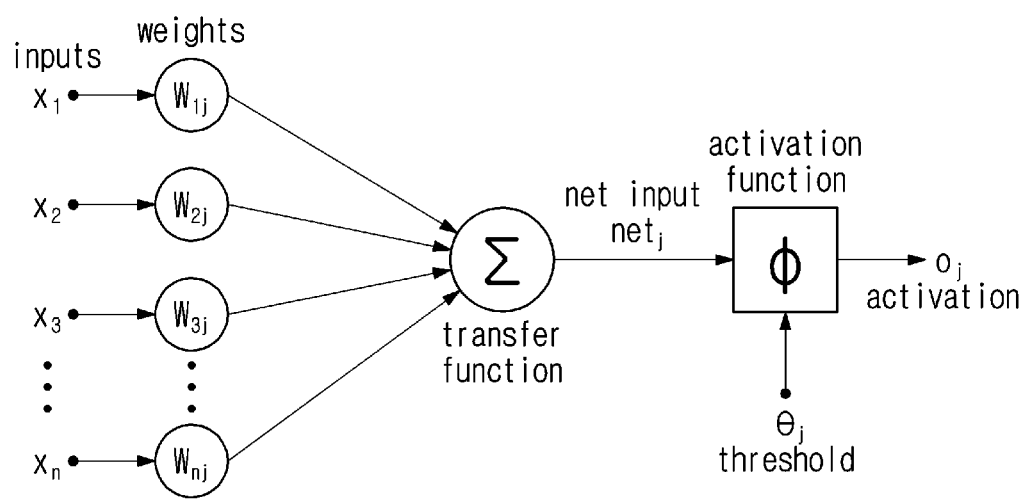
FIG. 11 is a view showing a neural network that is applicable to the present disclosure.

FIG. 11 is a view showing an electromagnetic spectrum applicable to the present disclosure. For example, referring to FIG. 11, THz waves which are known as sub-millimeter radiation, generally indicates a frequency band between 0.1 THz and 10 THz with a corresponding wavelength in a range of 0.03 mm to 3 mm. A band range of 100 GHz to 300 GHz (sub THz band) is regarded as a main part of the THz band for cellular communication. When the sub-THz band is added to the mmWave band, the 6G cellular communication capacity increases. 300 GHz to 3 THz of the defined THz band is in a far infrared (IR) frequency band. A band of 300 GHz to 3 THz is a part of an optical band but is at the border of the optical band and is just behind an RF band. Accordingly, the band of 300 GHz to 3 THz has similarity with RF.

The main characteristics of THz communication include (i) bandwidth widely available to support a very high data rate and (ii) high path loss occurring at a high frequency (a high directional antenna is indispensable). A narrow beam width generated by the high directional antenna reduces interference. The small wavelength of a THz signal allows a larger number of antenna elements to be integrated with a device and BS operating in this band. Therefore, an advanced adaptive arrangement technology capable of overcoming a range limitation may be used.

THz Wireless Communication

FIG. 10 is a view showing a THz communication method applicable to the present disclosure.

Referring to FIG. 10, THz wireless communication uses a THz wave having a frequency of approximately 0.1 to 10 THz (1 THz=1012 Hz), and may mean terahertz (THz) band wireless communication using a very high carrier frequency of 100 GHz or more. The THz wave is located between radio frequency (RF)/millimeter (mm) and infrared bands, and (i) transmits non-metallic/non-polarizable materials better than visible/infrared rays and has a shorter wavelength than the RF/millimeter wave and thus high straightness and is capable of beam convergence.

FIG. 11 is a view showing a neural network that is applicable to the present disclosure.

As described above, the artificial intelligence (AI) technology may be introduced to a new communication system (e.g., 6G system). Herein, the AI may utilizes a neural network as a machine learning model that imitates human brain.

Specifically, a device may process arithmetic operations of 0 and 1 and, based on this, execute an operation and communication. Herein, the technical advances enable devices to process more arithmetic operations in a shorter time and with lower power consumption. On the other hand, people cannot do arithmetic operations as fast as devices. Human brains may not have been made only to process arithmetic operations as fast as possible. However, people can perform other operations like recognition and natural language processing. Herein, the above-described operations are intended to process things beyond arithmetic operations, and devices cannot currently process those things at a level achieved by human brains. Accordingly, it may be worthwhile to consider creating a system that makes devices achieve human-level performance in such areas as natural language processing and computer vision. In consideration of what is described above, a neural network may be a model based on the idea that human brain can be imitated.

Herein, a neural network may be a simple mathematical model built upon the above-described motivation. Herein, the human brain may consist of an enormous number of neurons and synapses connecting neurons. In addition, according to how each neuron is activated, an action may be taken by selecting whether or not other neurons are activated. Based on the above-described facts, a neural network may define a mathematical model.

As an example, it is possible to generate a network in which neurons are nodes and synapses connecting the neurons are edges. At this time, each synapse may have a different importance. That is, a weight may be defined separately for each edge.

As an example, referring to FIG. 11, a neural network may be a directed graph. That is, information propagation may be fixed in a single direction. As an example, in case there is an undirected edge or identical directed edges are given in both directions, information propagation may occur recursively. Accordingly, the neural network may have complex results. As an example, a neural network as described above may be a recurrent neural network (RNN). Herein, since a RNN has an effect of storing past data, it has frequently used to process sequential data like voice recognition in recent years. In addition, a multi-layer perception (MLP) architecture may be a directed simple graph.

Herein, there is no connection in a same layer. That is, there is neither self-loop and nor a parallel edge, and an edge may exist only between layers. In addition, an edge may exist only between layers adjacent to each other. That is, in FIG. 11, there is no edge connecting a first layer and a fourth layer. As an example, unless there is a special remark on a layer, it may be the above-described MLP but is not limited thereto. In the above-described case, information propagation may occur only in a forward direction. Accordingly, the above-described network may be a feed-forward network but is not limited thereto.

In addition, as an example, in an actual brain, different neurons may be activated, and a corresponding result may be delivered to a next neuron. In the above-described method, a neuron making a final decision may activate a result value and the process information. Herein, if the above-described method is changed into a mathematical model, an activation condition for input data may be expressed by a function. Herein, the above-described function may be referred to as an activate function.

As an example, the simplest activate function may be a function that aggregates all the input data and then compares the sum with a threshold. As an example, in case a sum of all input data exceeds a specific value, a device may process information by activation. On the other hand, in case a sum of all input data does not exceed a specific value, a device may process information by inactivation.

As another example, there may be various forms of activate functions. As an example, for convenience of explanation, Equation 1 may be defined. Herein, in Equation 1, not only a weight but also a bias need to be considered, and the weight and the bias may be expressed as in Equation 2. However, since a bias (b) and a weight (w) are almost identical with each other, the description below will consider only the weight. However, the present disclosure is not limited thereto. As an example, since $w_0$ becomes a bias by adding $x_0$ that always has a value of 1, a virtual input may be assumed so that the weight and the bias can be treated to be identical, but the present disclosure is not limited to the above-described embodiment.

$$t = \sum_i w_i x_i \qquad \text{[Equation 1]}$$

$$t = \sum_i w_i x_i + b_i \qquad \text{[Equation 2]}$$

A model based on what is described above may first define a shape of a network consisting of a node and an edge. Then, the model may define an activate function for each node. In addition, a parameter adjusting the model has a role of a weight of edge, and a mathematical model may be trained to find a most appropriate weight. As an example, Equation 3 to Equation 6 below may be one form of the above-described activate function but are not limited to a specific form.

$$\text{Sigmoid function: } f(t) = \frac{1}{1 + e^{-t}} \qquad \text{[Equation 3]}$$

$$\text{Tanh function: } f(t) = \frac{1 - e^{-t}}{1 + e^{-t}} \qquad \text{[Equation 4]}$$

$$\text{Absolute function: } f(t) = \|t\| \qquad \text{[Equation 5]}$$

$$\text{ReLu function: } f(t) = \max(0, t) \qquad \text{[Equation 6]}$$

In addition, as an example, in case a mathematical model is trained, it is necessary to assume the every parameter is determined and to check how a neural network interfaces with a result. Herein, the neural network may first determine, for a given input, activation of a next layer and then determine activation of a next layer according to the determined activation. Based on the above-described method, an interface may be determined by checking a result of a last decision layer.

Figure 12:
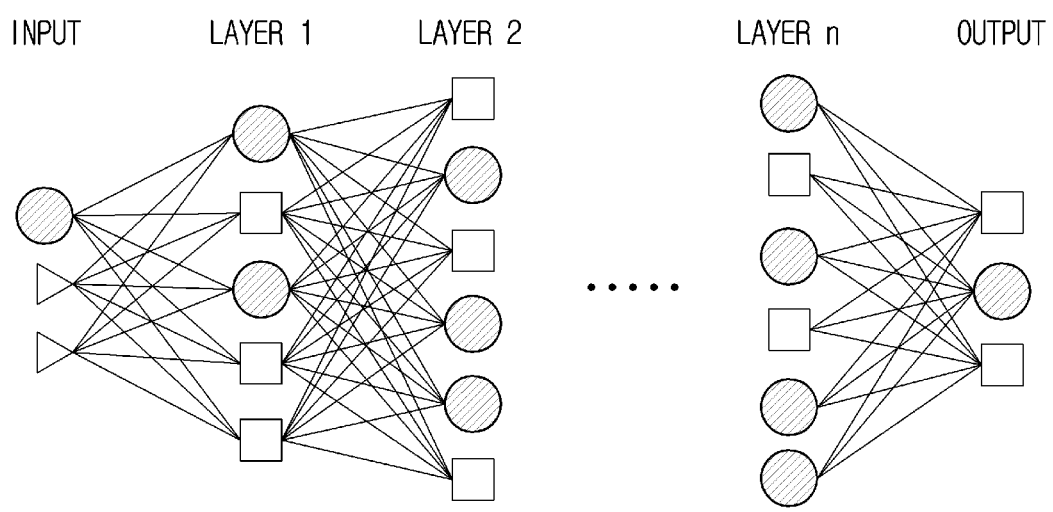
FIG. 12 is a view showing an activation node in a neural network that is applicable to the present disclosure.

As an example, FIG. 12 is a view showing an activation node in a neural network applicable to the present disclosure. Referring to FIG. 12, when classification is performed, after as many decision nodes as the number of classes to be classified are generated in a last layer, one of the nodes may be activated to select a value.

In addition, as an example, it is possible to consider a case in which activate functions of a neural network is non-linear and the functions forms a complicated configuration by becoming layers for each other. Herein, weight optimization of a neural network may be non-convex optimization. Accordingly, it may be impossible to find a global optimum of parameters of the neural network. In consideration of what is described above, a method of converging to a suitable value may be used by the gradient descent method. As an example, every optimization problem can be solved only when a target function is defined.

In a neural network, a loss function may be calculated between a target output that is actually wanted in a final decision layer and an estimated output generated by a current network, and thus a corresponding value may be minimized. As an example, a loss function may be Equation 7 to Equation 9 below but is not limited thereto.

Herein, it is possible to consider a case in which a d-dimensional target output and an estimated output are defined as $t=[t_1, \ldots, t_d]$ and $x=[x_1, \ldots, x_d]$ respectively. Here, Equation 7 to Equation 9 may be a loss function for optimization.

$$\text{Sum of Euclidean loss: } \sum_{i=1}^{d}(t_i - x_i)^2 \qquad \text{[Equation 7]}$$

Softmax loss: [Equation 8]

$$-\sum_{i=1}^{d} t_i \log \frac{x^{x_j}}{\sum_{j=1}^{d} e^{x_j}} + (1 - t_i)\log\left(1 - \frac{e^{x_j}}{\sum_{j=1}^{d} e^{x_j}}\right)$$

Cross-entropy loss: [Equation 9]

$$-\sum_{i=1}^{d} t_i \log x_i + (1 - t_i)\log(1 - x_i)$$

In case the above-described loss function is given, gradients may be obtained for parameters, and then the parameters may be updated using the values.

As an example, a backpropagation algorithm may be an algorithm that simply calculates a gradient by using a chain rule. Based on the above-described algorithm, parallelization may also be easy to calculate a gradient of each parameter. In addition, a memory may also be saved through an algorithm design. Accordingly, a backpropagation algorithm may be used for updating a neural network. In addition, an example, a gradient for a current parameter needs to be calculated to use the gradient descent method. Herein, when a network becomes complex, a corresponding value may be complicated to calculate. On the other hand, in a backpropagation algorithm, a loss is first calculated by using a current parameter, and how much the loss is affected by each parameter may be calculated through a chain rule. An update may be performed based on a calculated value. As an example, a backpropagation algorithm may be divided into two phases. The one may be a propagation phase, and the other may be a weight update phase. Herein, in the propagation phase, an error or a change amount of each neuron may be calculated from a training input pattern. In addition, as an example, in the weight update phase, a weight may be updated by using a previously calculated value. As an example, the specific phases may be described as in Table 6 below.

TABLE 6

Figure 25:
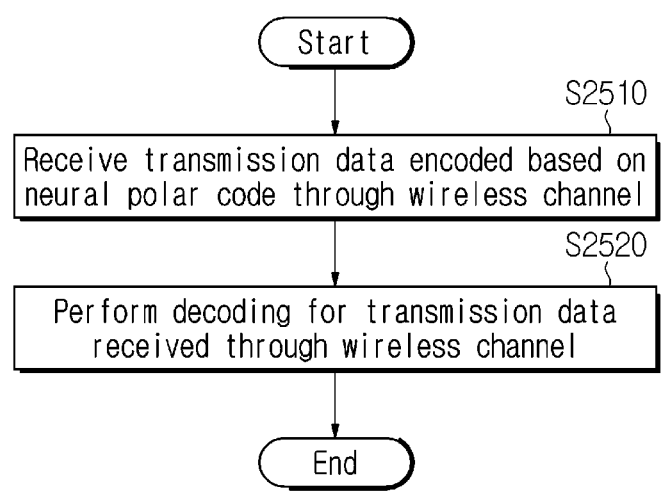
FIG. 25 is a view showing a method of operating a terminal that is applicable to the present disclosure.

Phase 1: Propagation
Forward propagation: calculates an output from input training data and calculates an error at each output neuron. Here, since information flows in the direction of input -> hidden -> output, it is called 'forward' propagation.
Back propagation: calculates, by using a weight of each edge, how much an error calculated at an output neuron is affected by neuron of a previous layer. Here, since information flows in the direction of output -> hidden, it is called 'back' propagation.
Phase 2: Weight update
Gradients of parameters are calculated by using a chain rule. Here, as shown in FIG. 25, the usage of a chain rule means that a current gradient is updated by using a previously-calculated gradient.

As an example, in a new communication system (e.g., 6G), an autoencoder scheme may be applied as a channel coding scheme. Herein, in order to improve performance, an autoencoder may configure both a transmitter and a receiver as a neural network and perform optimization from the end-to-end perspective, and channel coding may be performed based on the autoencoder. Herein, in a wireless communication system, channel coding may be essential to ensuring reliable transmission. As an example, in a new communication system, reliable transmission of data needs to be ensured in vehicle-to-vehicle communication or other types of communication, and in consideration of this, a requirement for ensuring reliability may become higher.

Herein, channel coding may enable reliable communication by recovering an original signal through redundant information, when an error occurs due to an external factor like noise during a signal delivery process between a transmitter and a receiver. At this time, a code rate of a transmission signal may be determined according to a ratio of redundant information. As an example, a coding method with higher capability of error correction for code rate may be needed for reliable transmission. Recently, in a wireless communication system (e.g., NR), data transmission and reception may be performed by applying a polar coding method using channel polarity.

Herein, by using channel polarity, a polar coding method may achieve a channel capacity in a basic communication channel situation, when a block size becomes longer. However, for a short block length, polar coding may have at least one problem of performance, coloured noise, fading loss, and reception decoding complexity. The above-described features may be different according to a spatial and temporal channel environment, but a channel coding scheme solving the above-described problem of polar coding may be needed to ensure reliable transmission, which will be described below.

Figure 13:
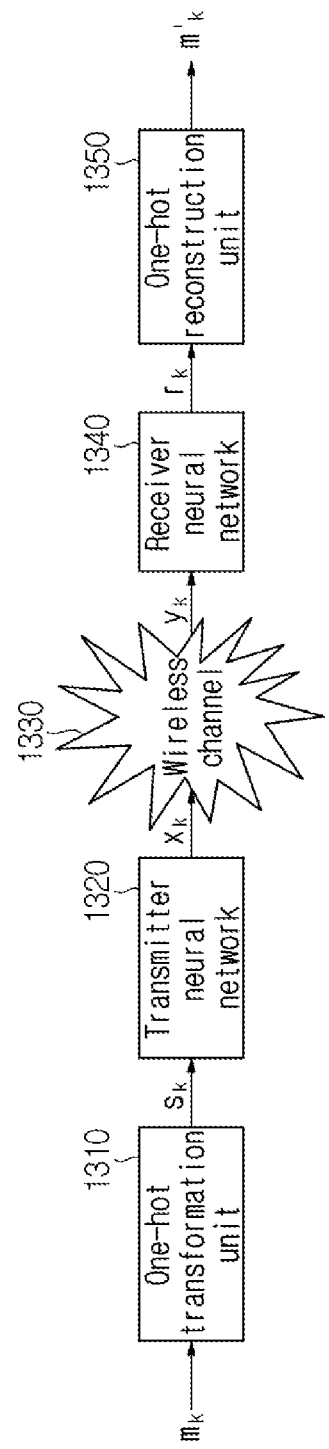
FIG. 13 is a view showing a neural network-based communication system that is applicable to the present disclosure.

FIG. 13 is a view showing a neural network-based communication system that is applicable to the present disclosure. As an example, as described above, communication may be performed based on a neural network in a wireless communication system.

Referring to FIG. 13, data may be transmitted and received based on an autoencoder scheme that is neural network-based communication. In an autoencoder scheme, communication may be performed through a transmitter neural network 1320 and a receiver neural network 1340. Specifically, a binary information signal sequence ($m_k$) may be transformed into a target signal sequence ($s_k$) in a one-hot transformation unit 1310. Herein, the one-hot transformation unit 1310 may be configured to perform transformation in order to apply data such as a natural language to a neural network. However, the one-hot transformation unit 1310 may operate based on another transformation unit and is not limited to the above-described embodiment. Next, the transmitter neural network 1320 may modify the target signal sequence ($s_k$) to a transmission signal sequence ($x_k$) for transmission, and a transmitter may the transmission signal sequence ($x_k$) to a receiver through a wireless channel 1330. Herein, the receiver may obtain a decoding signal sequence ($r_k$) in the receiver neural network 1340 from a reception signal sequence ($y_k$) that is transmitted through the wireless channel 1330. That is, the receiver may receive a signal sequence including an effect of a channel environment such as fading distortion and noise based on the wireless channel 1330. Next, the decoding signal sequence ($r_k$) may be transformed into a binary decoding signal sequence ($m'_k$) through a one-hot reconstruction unit 1350. That is, the target signal sequence ($s_k$) and the decoding signal sequence ($r_k$) may be one-hot vectors that are transformed from the binary information signal sequence ($m_k$) and the binary decoding signal sequence ($m'_k$) by considering application of a neural network. Accordingly, a binary information signal sequence with k length may become a one-hot vector with 2K length. In addition, a decoding signal sequence with 2L length may become a binary decoding signal sequence with L length. That is, as the length K of information increases, data transformed into one-hot vector increases exponentially so that there can be a limit in a block with a long length.

Herein, the relationship between the target signal sequence ($s_k$) of the transmitter and the transmission signal sequence ($x_k$) may be as in Equation 10 below, and the relationship between the decoding signal sequence ($r_k$) and the reception signal sequence ($y_k$) may be as in Equation 11 below.

$$x_k = f_{AE}^{Tx}(s_k) \quad \text{[Equation 10]}$$

$$r_k = f_{AE}^{Rx}(y_k) \quad \text{[Equation 11]}$$

Here, $f_{AE}^{Tx}(\bullet)$ and $f_{AE}^{Rx}(\bullet)$ may be functions operated by the transmitter neural network 1320 and the receiver neural network 1340 respectively. As an example, in the case of a neural network using fully connected layers including a single hidden layer, the transmitter neural network 1320 may be expressed as in Equation 12 below.

$$x_k = f_{AE}^{Tx}(s_k) = f_{SM}(W_2 f_{relu}(W_1 s_k + b_1) + b_2) \quad \text{[Equation 12]}$$

Here, xk is a real number matrix of M×1, W1 and W2 are real number matrices of H×2K and M×H respectively, b1 and b2 are real number vectors of H×1 and M×1 respectively, and $f_{relu}(\bullet)$ and $f_{SM}(\bullet)$ may correspond to ReLU and Soft-max activation functions respectively. Herein, 2K, H and M may be the numbers of nodes of an input layer, a hidden layer and an output layer respectively. The number of nodes of an output layer is M=K/R/L, R may be a coding rate to be achieved by an autoencoder, and L may be a modulation order of an output symbol.

Based on what is described above, the receiver neural network 1340 may be expressed as in Equation 13 below.

$$r_k = f_{AE}^{Rx}(y_k) = f_{SM}(W_2 f_{relu}(W_1 y_k + b_1) + b_2) \quad \text{[Equation 13]}$$

Here, $y_k$ is a real number matrix of M×1, W1 and W2 are real number matrices of H×M and 2K×H respectively, and b1 and b2 are real number vectors of H×1 and 2K×1 respectively. Herein, M, H and 2K may be the numbers of nodes of an input layer, a hidden layer and an output layer respectively. In addition, the number of nodes of an output layer may be identical with a length of a target signal sequence.

In the case of the above-described autoencoder scheme, the whole channel coding may be performed based on a neural network. Herein, since the whole channel coding process is implemented through a neural network, if the size of a binary information signal sequence increases, the training of a transmission neural network and a reception neural network may become complex in proportion to exponentiality. Specifically, the number of input nodes of a transmission neural network and the number of output nodes of a reception neural network have a length of 2K, which can increase in proportion to the exponentiality of K that is a size of an information signal sequence. Hence, when the size of a binary information signal sequence increases, the training of the transmission neural network and the reception neural network may become complex in proportion to exponentiality.

Herein, a long coding block may be needed to achieve high coding performance. In consideration of what is described above, when the length of a processing signal sequence of an autoencoder becomes longer, training for channel coding based on a neural network may be difficult due to increasing complexity.

In consideration of what is described above, in an autoencoder-based communication, a new neural channel coding scheme may be required which can not only maintain the advantage of channel situation fitness and relatively low decoding complexity but also process codes for a long block where existing channel coding can be implemented, and the new neural channel coding scheme will be described below.

Figure 14:
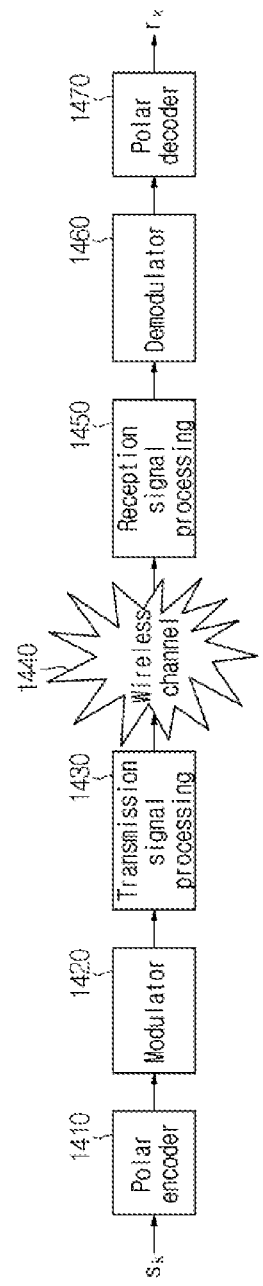
FIG. 14 is a view showing a communication system based on polar coding that is applicable to the present disclosure.

FIG. 14 is a view showing a communication system based on polar coding that is applicable to the present disclosure. As an example, referring to FIG. 14, a binary information signal sequence ($s_k$) may be changed to a transmission signal sequence ($x_k$) at a transmitter through a polar encoder 1410, a modulator 1420, and a transmission signal processing unit 1430. Then, the transmission signal sequence ($x_k$) may be transmitted to a receiver through a wireless channel 1440. Herein, the receiver may obtain a decoding signal sequence ($r_k$) through a reception signal processing unit 1450, a demodulator 1460, and a polar decoder 1470 from a reception signal sequence ($y_k$) that is transmitted through the wireless channel 1440.

Figure 15:
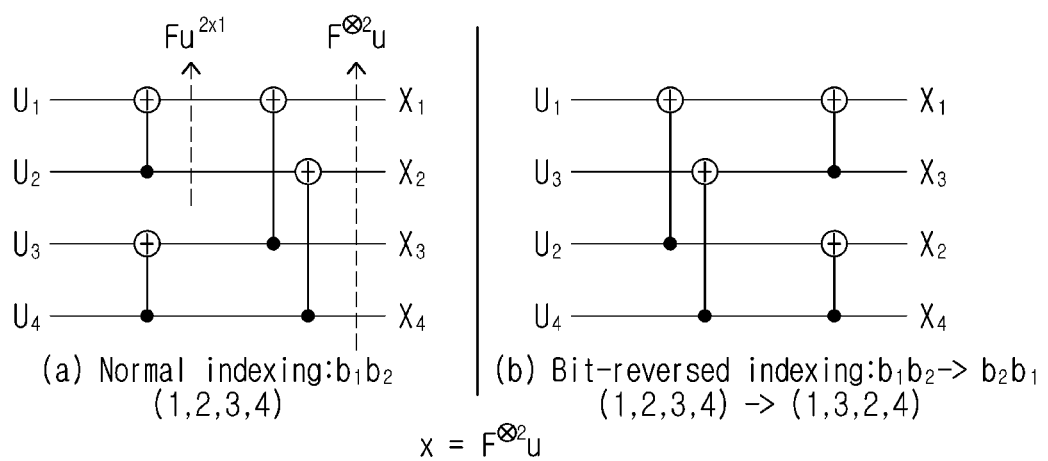
FIG. 15 is a view showing a method of performing polar coding that is applicable to the present disclosure.

Herein, an encoding procedure based on the polar encoder 1410 in the transmitter may be as in FIG. 15. As an example, polar coding may be a scheme that improves an achievement rate of channel capacity. Referring to FIG. 15, in case the polar encoder 1410 includes a binary information signal sequence ($s_k$) with a length of K, the polar encoder 1410 may generate a fixed information signal sequence with every information of (N−K) set to 0 and a polar input signal sequence ($u_k$) with an added length of N, and $u_k$ is polar transformed so that corresponding transformed values can be output as an encoding result. As an example, polar transformation may omit an index k, that is, a time element, and may be expressed as Equation 14 below.

$$x = Gu = F^{\otimes n} u \qquad \text{[Equation 14]}$$

As an example, a polar code encoding rate may be R=K/N. Here, G is a polar transformation matrix and is configured like $G = F^{\otimes n}$, and a basic polar transformation matrix F and an n-order transformation matrix $F^{\otimes n}$ may be expressed as in Equation 15 below.

$$F = \begin{bmatrix} 1 & 1 \\ 0 & 1 \end{bmatrix}, \qquad \text{[Equation 15]}$$

$$G = F^{\otimes n} = \begin{bmatrix} F^{\otimes n-1} & F^{\otimes n-1} \\ 0 & F^{\otimes n-1} \end{bmatrix}$$

As a concrete example, a case of a code block with a length of N=2² may be considered. That is, when n is 2, a polar transformation matrix $F^{\otimes 2}$ may be configured as in Equation 16 below.

$$F^{\otimes 2} = \begin{bmatrix} F & F \\ 0 & F \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix}, \qquad \text{[Equation 16]}$$

$$\begin{bmatrix} X_1 \\ X_2 \\ X_3 \\ X_4 \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix} \begin{bmatrix} U_1 \\ U_2 \\ U_3 \\ U_4 \end{bmatrix}$$

Here, x=[X1 X2 X3 X4] and u=[U1 U2 U3 U4] may be possible. As an example, (a) of FIG. 15 and (b) of FIG. 15 may be views showing N=2²=4. Herein, (a) of FIG. 15 is a case of arranging indexes of input/output variables in a normal descending order, and (b) of FIG. 15 is an input operation process of arranging indexes in a bit-reversed order, where indexes may be indicated as in (1, 3, 2, 4). However, irrespective of the above-described method of indicating indexes, both cases may have a same transformation equation $x = F^{\otimes 2} u$. Herein, in FIG. 15, u2x1=[U1 U2] may be possible.

Figure 16:
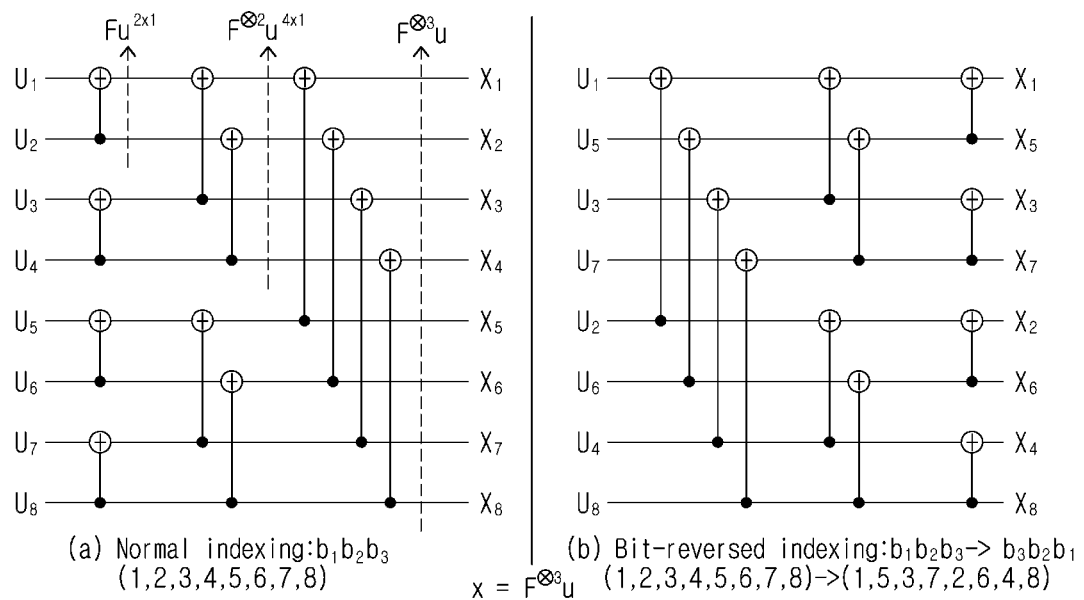
FIG. 16 is a view showing a method of performing polar coding that is applicable to the present disclosure.

As another example, FIG. 16 is a view showing a case of N=2³=8. Specifically, in the case of N=2³=8, a polar transformation matrix may be applied as expressed in Equation 17.

$$F^{\otimes 2} = \begin{bmatrix} F & F \\ 0 & F \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix}, \qquad \text{[Equation 17]}$$

$$\begin{bmatrix} X_1 \\ X_2 \\ X_3 \\ X_4 \end{bmatrix} = \begin{bmatrix} 1 & 1 & 1 & 1 \\ 0 & 1 & 0 & 1 \\ 0 & 0 & 1 & 1 \\ 0 & 0 & 0 & 1 \end{bmatrix} \begin{bmatrix} U_1 \\ U_2 \\ U_3 \\ U_4 \end{bmatrix}$$

Here, x may be [X1 X2 X3 X4 X5 X6 X7 X8], and u may be [U1 U2 U3 U4 U5 U6 U7 U8]. As an example, (a) of FIG. 16 and (b) of FIG. 16 may be views showing the case of N=2³=8. Herein, (a) of FIG. 16 may be a case of arranging indexes of input/output variables in a normal descending order, and (b) of FIG. 16 may be an input operation process for arranging indexes in a bit-reversed order. However, irrespective of the above-described method of indicating indexes, both cases may have a same transformation equation $x = F^{\otimes 2} u$. Herein, in FIG. 16, u4x1=[U1 U2 U3 U4] may be possible.

Figure 17:
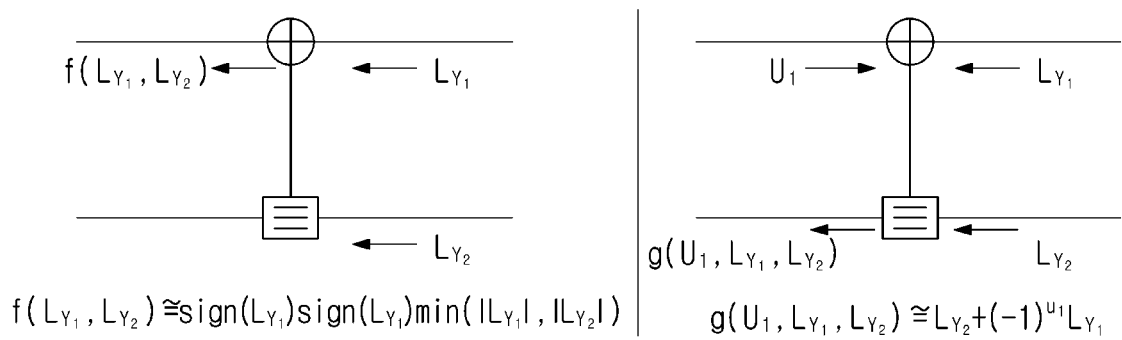
FIG. 17 is a view showing a method of performing decoding based on polar coding that is applicable to the present disclosure.

FIG. 17 is a view showing a decoding method based on polar coding that is applicable to the present disclosure.

Referring FIG. 17, a receiver may receive a signal, which is encoded based on a polar code, and decode the signal.

Herein, as an example, encoding of a polar code may have a form based on repetition of a same pattern, and decoding may also be performed based on a block size of N=2n in a repetitive process form of processing two reception bits. As an example, in FIG. 17, when polar decoding is performed for a basic block (N=2), a receiver may receive signals $Y_1$ and $Y_2$ from a wireless channel during 2T. However, this is merely one example, and the present disclosure is not limited to the above-described embodiment.

Herein, a wireless channel may affect a signal according to a channel environment like the above-described fading and noise. As an example, based on a wireless channel, reception signals $Y_1$ and $Y_2$ may be as in Equation 18.

$$Y_i=(1-2X_i)+n, i=1,2 \quad \text{[Equation 18]}$$

Here, $(1-2X_i) \in \{1,-1\}$ may be a transmission signal with an average size of 1, n may be an additive white Gaussian noise (AWGN) signal with an average of 0 and variance of $1/\rho_{SNR}$, and $\rho_{SNR}$ may be a signal noise ratio (SNR). Herein, first, a polar decoder may derive log likelihood ratios (LLR) $L_{Y_1}$ and $L_{Y_2}$ for two reception signals $Y_1$ and $Y_2$ based on Equation 19 and Equation 20 below.

$$L_{Y_i} = \ln\frac{P(Y_i \mid x=0)}{P(Y_i \mid x=1)} = 2\rho_{SNR}Y_i, i=1,2 \quad \text{[Equation 19]}$$

$$P(Y_i \mid X=b) = \sqrt{\frac{\rho_{SNR}}{2\pi}} e^{-\frac{\rho_{SNR}(Y_i-(1-2b))^2}{2}} \quad \text{[Equation 20]}$$

When the LLR $L_{Y_1}$ and $L_{Y_2}$ are derived based on Equation 19 and Equation 20, LLR outputs $L_{X_1}$ and $L_{X_2}$ for two branches may be given as in Equation 21 and Equation 22.

$$L_{X_1}=f(L_{Y_1},L_{Y_2}) \quad \text{[Equation 21]}$$

$$L_{X_2}=g(U_1,L_{Y_1},L_{Y_2}) \quad \text{[Equation 22]}$$

Herein, a function f( ) of Equation 21 may be the same as Equation 23 below, and a function g( ) of Equation 22 may be the same as Equation 24 below. Herein, U1 of the function g( ) of Equation 24 may be a result that discerned by {0, 1} after calculating $L_{x1}$, and polar decoding may be performed based on what is described above. That is, as described above, decoding of a polar code may be derived based on an LLR.

$$f(L_{Y_1},L_{Y_2}) \cong \text{sign}(L_{Y_1})\text{sign}(L_{Y_2})\min(|L_{Y_1}|,|L_{Y_2}|) \quad \text{[Equation 23]}$$

$$g(U_1,L_{Y_1},L_{Y_2}) \cong L_{Y_2}+(-1)^{U_1}L_{Y_1} \quad \text{[Equation 24]}$$

As described above, various types of coding schemes may be applied to a signal by considering a wireless channel. Herein, as an example, a polar code using channel polarity may be advantageous for a long block. On the other hand, in case training for channel coding is performed based on an autoencoder, since training complexity increases by $2^n$ according to a transmission sequence bit, the autoencoder may be advantageous for a short block. Specifically, a polar code operates even in a long coding block size, but there may be a performance limitation of channel coding in various situations apart from a basic one, including a short block length, a coloured noise, a fading loss, and low-complexity reception. On the other hand, since an autoencoder scheme uses a neural network of a transmitter and a receiver, modulation, signal processing and coding may be optimized at the same time, and complexity of receiver processing may also be reduced. On the other hand, in case the size of a coding block is long, since the size of a neural network input increases exponentially, training is very difficult, which is a disadvantage. In consideration of what is described above, an effective method of performing channel coding, which combines a polar code scheme and an autoencoder transmission scheme as channel coding schemes, may be needed, which will be described below.

Figure 18:
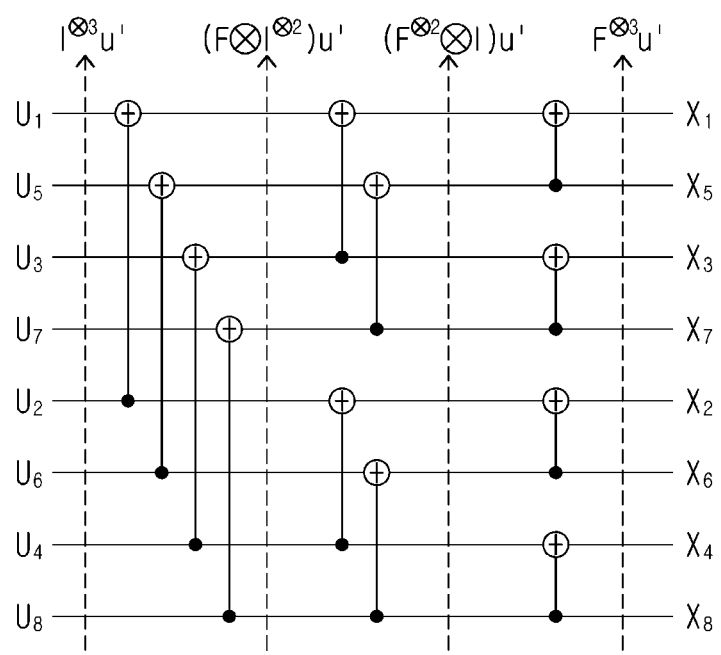
FIG. 18 is a view showing a method of performing polar transformation based on partial polar coding that is applicable to the present disclosure.

As an example, FIG. 18 is a view showing a method of performing polar transformation based on partial polar coding that is applicable to the present disclosure.

Referring to FIG. 18, complementary application of polar code and autoencoder schemes may be configured to apply the polar code scheme for coding signs, which are relatively distant from each other, and to use an autoencoder encoding neural network scheme for coding adjacent signs.

That is, environment optimization may be performed by applying a polar code scheme for coding codes, which are separate as far from each other as a preset distance, and by applying an autoencoder scheme for coding codes that are adjacent to each other within a preset distance. Herein, a channel coding scheme combining the autoencoder and polar code schemes may be a neural polar code encoding method but is not limited to the above-described name. That is, a channel coding scheme, which combines and uses polar code and autoencoder schemes, may be used under another name and may not be limited to a specific name. However, hereinafter, for convenience of description, it will be called neural polar code.

Herein, in a neural polar code, preprocessing may be performed at the front end in an autoencoder where an binary input is input as an input of the autoencoder. As an example, a preprocessing process may be a process of modifying a binary input based on a one-hot vector but may not be limited thereto. In addition, as an example, in a neural polar code, an output of an autoencoder may be binary phase shift keying (BPSK), and an encoding rate may be 1. However, this is merely one example and may be differently configured.

As an example, when channel coding is performed based on a neural polar code, it may be a case in which the length of a code block is N and the number of adjacent bits to be processed by an AE encoding neural network is K. Accordingly, the number of autoencoders necessary for data processing may be M=N/K, and encoding may be performed as in Equation 25 and Equation 26. Herein, X', Z', and U' may be factors that are rearranged in a bit-reversed order of X, Z and U. When N=8, u'=[U'1 U'2 U'3 U'4 U'5 U'6 U'7 U'8]=[U1 U5 U3 U7 U2 U6 U4 U8] may be a specific example.

$$[X'_{Km+1}, X'_{Km+2}, \ldots, X'_{Km+K}] = AE_m^{Tx}(Z'_{Km+1}, Z'_{Km+2}, \ldots Z'_{Km+K}), \quad \text{[Equation 25]}$$

for m=0, 1, . . . , M−1

$$z'=M_{n,p}u'=(F^{\otimes(n-p)}\otimes I^{\otimes p})u' \quad \text{[Equation 26]}$$

Here, $AE_m^{Tx}(\cdot)$ may be an m-th AE encoding neural network, and $\otimes$ in the equation may be a Kronecker product operator. n may be log 2(N), p may be log 2(K), and $$I = \begin{bmatrix} 1 & 0 \\ 0 & 1 \end{bmatrix}$$

may be a 2×2 unit matrix. Herein, the transformation by $M_{n,p}=F^{\otimes(n-p)}\otimes I^{\otimes p}$ in Equation 26 may be defined as partial polar transformation. As an example, FIG. 18 may be a method of performing decoding through partial polar transformation based on a neural polar code with N=8.

Figure 19A:
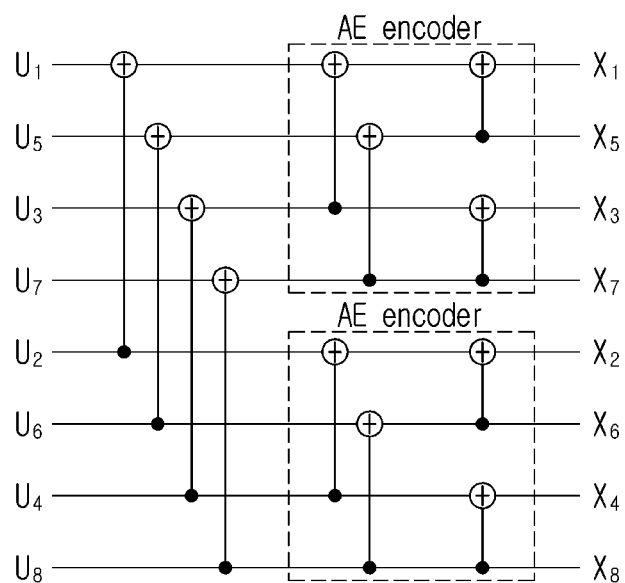
FIG. 19A is a view showing a method of performing polar transformation based on partial polar coding that is applicable to the present disclosure.

In addition, FIG. 19A is a view showing a case where the length of a code block is N=8 and the number of adjacent bits to be processed by an autoencoder encoding neural network is K=4. As an example, referring to FIG. 19A, since N is 8 and K is 4, the number of required autoencoders M(=N/K) may be 2. Herein, as an example, a neural polar code may generate an encoding signal by being applied based on Equation 27, Equation 28 and Equation 29 below that are based on the above-described Equation 25 and Equation 26. Herein, referring to FIG. 19A, a polar code may be applied to non-adjacent bits among bits of U, an autoencoder may be applied for bits that are adjacent to each other, and in consideration of this, each of the bits of U may be adjusted as in FIG. 19A.

$$[X'_{4m+1}, X'_{4m+2}, \ldots, X'_{4m+4}] = AE_m^{Tx}(Z'_{4m+1}, Z'_{4m+2}, \ldots, Z'_{4m+4}), \text{for } m=0,1 \quad \text{[Equation 27]}$$

$$[Z' = M_{k+1}, Z'_{4+k+1}] = F^{\otimes \log 2M}[U'_{k+1}, U'_{4+k+1}], \text{for } k=0, 1, \ldots 3 \quad \text{[Equation 28]}$$

$$z' = M_{3,2} u' = (\otimes I^{\otimes 2}) u'$$

Figure 19B:
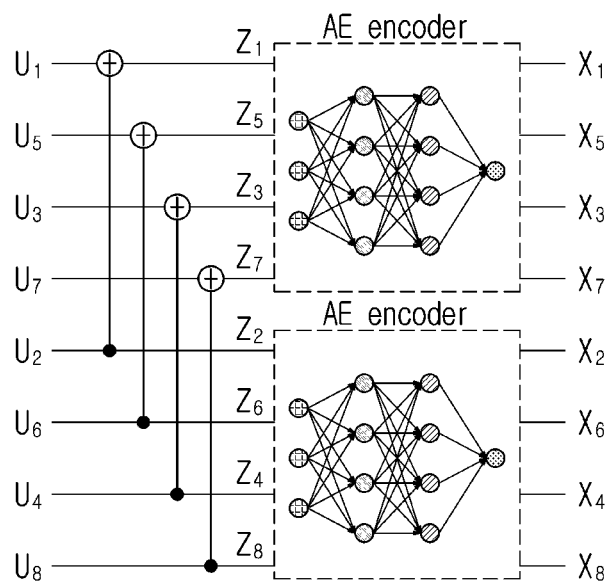
FIG. 19B is a view showing a method of performing polar transformation based on partial polar coding that is applicable to the present disclosure.

In addition, as an example, referring to FIG. 19B, there may be a part where a neural polar code is replaced by an autoencoder. As an example, a neural polar code may have each layer, and whether to apply a polar code and an autoencoder may be determined based on layer information. Specifically, FIG. 19B may consist of two layers based on an autoencoder with K adjacent bits. Herein, a first layer may apply a polar code to bits that are not adjacent to each other. Herein, an output bit of the first layer may be an input bit of a second layer, and the second layer may be replaced by an autoencoder layer in a polar code based on the adjacent bit number K of the autoencoder. Herein, as an example, in case a plurality of layers is replaced by an autoencoder, the degree of freedom of training is increased but there may be a limitation of training convergence due to an increase of input.

Specifically, as an example, in case every layer is replaced by an autoencoder in FIG. 19A, if all the three layers are replaced by an autoencoder based on N-8, a neural polar code may have a same structure as the autoencoder.

In addition, as an example, it is possible to consider a case where three layers are distinguished in consideration of the adjacent bit number K being 2 in a neural polar code of FIG. 19A and an autoencoder is applied only to the last one layer. As another example, when no autoencoder is applied to any single layer, the result may be a same structure as an existing polar code. That is, in a neural polar code, a layer to which an autoencoder is applied may be differently selected and may not be limited to a specific form.

Herein, as an example, information on a layer to which an autoencoder is applied may be shared between a transmitter and a receiver. As an example, when a transmitter is a terminal and a receiver is a base station, the terminal and the base station may share information on a layer to which an autoencoder is applied. Herein, the information on the layer may be set based on an adjacent bit number of the autoencoder. As an example, a terminal and a base station may exchange information on a candidate adjacent bit of an autoencoder through higher layer signaling. As an example, a candidate adjacent bit may be determined by considering training complexity. Herein, when K is 2, the autoencoder may be applied only to a last one layer, when K is 4, the autoencoder may be applied to last two layers, when K is 8, the autoencoder may be applied to last three layers, and the autoencoder may be applied based on a same scheme. Herein, as an example, the base station may deliver information on a specific adjacent bit among candidate adjacent bits to the terminal through downlink control information (DCI), and the terminal may perform channel coding based on the received information.

As another example, between a base station and a terminal, a layer to which an autoencoder is applied may be preset during initial access. That is, in a neural polar code, a layer to which an autoencoder is applied may be preset in a process of performing initial access and may not be modified thereafter. As another example, a base station may indicate the above-described K value through DCI without a candidate adjacent bit, a terminal may identify a layer, to which an autoencoder is applied, based on the DCI, but the present disclosure is not limited to the above-described embodiment.

That is, in a neural polar code, a layer to which an autoencoder is applied may be preset or be flexibly modified, and a transmitter and a receiver may share information on a layer to which an autoencoder is applied, thereby improving channel coding efficiency.

Figure 20:
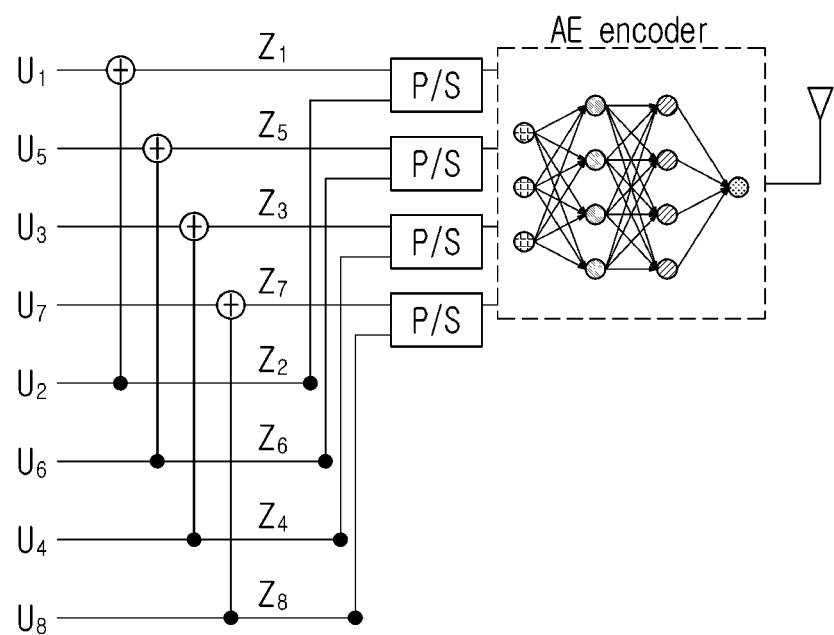
FIG. 20 is a view showing a method of performing partial polar coding-based polar transformation based on a time-sharing scheme that is applicable to the present disclosure.

As another example, FIG. 20 is a view showing a case of using only one autoencoder to reduce training complexity of a transmitter. As an example, as described above, M (N/K) autoencoders may be used based on an adjacent bit number K and a total bit stream N. Herein, referring to FIG. 20, only one autoencoder may be iteratively applied in a neural polar code. Specifically, a neural polar code may time divide signals of coding blocks, which are produced by executing polar coding, to use them as a single autoencoder input. That is, as signals of coding blocks, which are produced by executing polar coding, may be divided with respect to time and be applied to an autoencoder, only one autoencoder may be applied. As an example, signals of coding blocks, which are produced by executing polar coding, may be divided with respect to time by considering processing time of the signals, and thus only one autoencoder may be used.

Specifically, as an example, when N is 8 in FIG. 20, Z'1 and Z'5 signals may pass the parallel to serial (P/S) device and be input into a first port of an autoencoder. In addition, Z'2 and Z'6 signals may pass the P/S device and be input into a second port of the autoencoder. In addition, Z'3 and Z'7 signals may also pass the P/S device and be input into a third port of the autoencoder, and Z'4 and Z'8 signals may also pass the P/S device and be input into a fourth port of the autoencoder. That is, encoding may be performed with one autoencoder being fixed as $AE_m^{Tx}(\bullet) = AE^{Tx}(\bullet)$, and Z'1 and Z'5 may be divided and input based on time division, and likewise, another signal may be input based on time division.

As an example, in consideration of a low-latency operation, a transmitter may perform channel coding by using each of a plurality of autoencoders, but as described above, transmission may be performed based on a time division scheme using a single autoencoder in consideration of implementation complexity, and the present disclosure is not limited to the above-described embodiment.

Based on what is described above, a signal encoded through a neural polar code may be delivered from a transmitter to a receiver through a wireless channel. Herein, the receiver may perform decoding based on the neural polar code. Herein, as an example, the above-described polar encoding was described based on a case of an encoding rate of 1 with no fixed information bit, but a decoding method may be applied to every encoding rate and is not limited to a specific embodiment.

Figure 21:
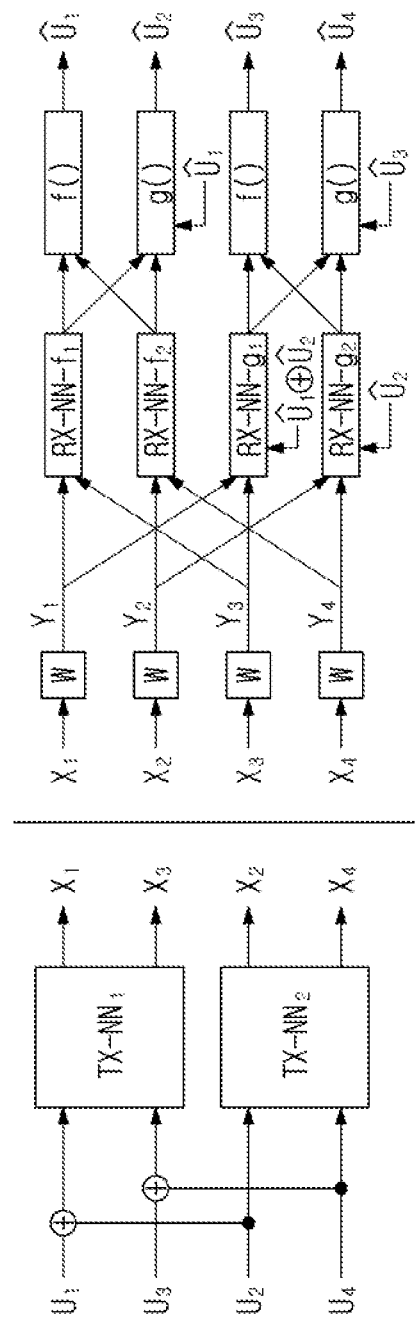
FIG. 21 is a view showing a method of performing decoding based on a neural polar code at a receiver that is applicable to the present disclosure.

As an example, referring to FIG. 21, a receiver may decode a signal that is encoded in a neural polar code.

Herein, based on a decoding neural network in each node, decoding may be performed in a successive cancellation (SC) scheme. Specifically, it is possible to consider a case where a code block length N is 4 and K of AE is 2. However, this is merely one example, and the present disclosure is not limited to the above-described embodiment. Herein, a decoding process based on a neural polar code may use two f( ) and two g( ) respectively which are defined in Equation 23 and Equation 24 above. As an example, a f( )-type neural network may output two inputs and one determined bit value, a g( )-type neural network may output three inputs and one determined bit value, and based on this, decoding may be performed.

As an example, in (a) of FIG. 21, u=[U1 U2 U3 U4] may be an encoding input signal, and x=[X1 X2 X3 X4] may be an encoding result signal. Herein, $U_1 \oplus U_2$ and $U_3 \oplus U4$ may be input into a 1st Tx-NN neural network. The neural network may perform encoding by using the input and output a result to X1 and X3. Herein, also in training, the 1st Tx-NN neural network may assume the same input and output as used at the step but may not be limited thereto.

In addition, $U_2$ and $U_4$ may be input into a 2nd Tx-NN neural network. The neural network may perform encoding by using the inputs and output a result to X2 and X4. Then, a transmission signal may be transmitted to a receiver through a wireless channel, and a reception signal y=[Y1, Y2, Y3, Y4] may be received. Herein, RX-NN-fi and RX-NN-gi may perform decoding based on the above-described neural network, and final decoding may be performed by applying a corresponding result to f( ) and g( ) as a decoding process of the above-described polar code. Specifically, referring to (b) of FIG. 21, RX-NN-f1, RX-NN-f2, RX-NN-g1, and RX-NN-g2 may be neural networks for decoding of a receiver. As an example, RX-NN-f may mean a neural network that performs processing without feedback removal, and Rx-NN-g may mean a neural network including feedback removal. As an example, the reception signal y=[Y1, Y2, Y3, Y4], which has passed through a channel, may be decoded without bit reversal. Herein, y may be a signal received by a receiver after x has passed through a wireless channel.

As an example, Y1 and Y3 may pass through RX-NN-f1, and a corresponding result may be output to f( ) and g( ). In addition, Y2 and Y4 may pass through RX-NN-f2, and a corresponding result may be output to f( ) and g( ). Herein, Rx-NN-f1 and Rx-NN-f2 may also be set to the same input and output as used at the step in training but may not be limited thereto. In addition, f( ) may use signals delivered from Rx-NN-f1 and Rx-NN-f2 as inputs, determine $\hat{U}_1$ as a result and output it. In addition, g( ), which is a function based on three input bits, may use each of the signals delivered from Rx-NN-f1 and Rx-NN-f2 and a predetermined $\hat{U}_1$ as inputs to determine $\hat{U}_2$ as a result and output it. In addition, Y1, Y3 and $\hat{U}_1 \oplus \hat{U}_2$ may pass through Rx-NN-g1, and a corresponding result may be output to f( ) and g( ). In addition, Y2, Y4 and $\hat{U}_2$ may pass through Rx-NN-g2, and a corresponding result may be output to f( ) and g( ). In addition, the neural networks Rx-NN-g1 and Rx-NN-g2 may also be set to the same input and output as used at the step in training but may not be limited thereto. f( ) may use each of the signals delivered from Rx-NN-g1 and Rx-NN-g2 as an input, determine $\hat{U}_3$ as a result and output it. In addition, g( ) may use each of the signals delivered from Rx-NN-g1 and Rx-NN-g2 and a predetermined $\hat{U}_3$ as inputs to determine $\hat{U}_4$ as a result and output it, and thus decoding may be performed in a receiver.

Figure 22A:
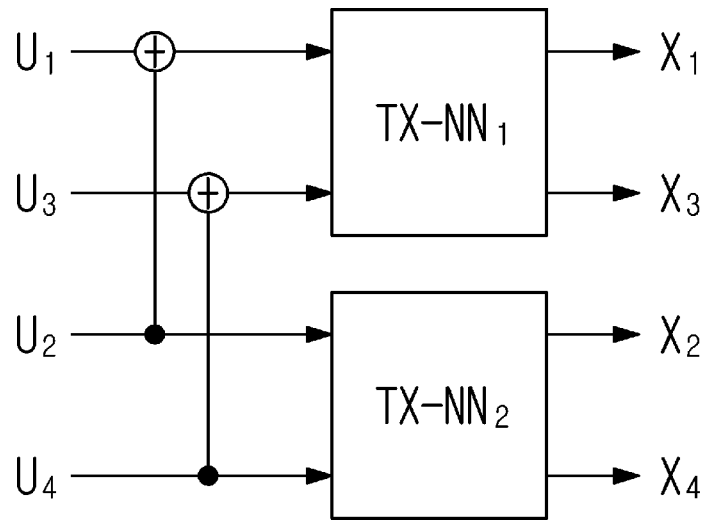
FIG. 22A is a view showing a method of performing decoding based on a neural polar code at a receiver that is applicable to the present disclosure.
Figure 22B:
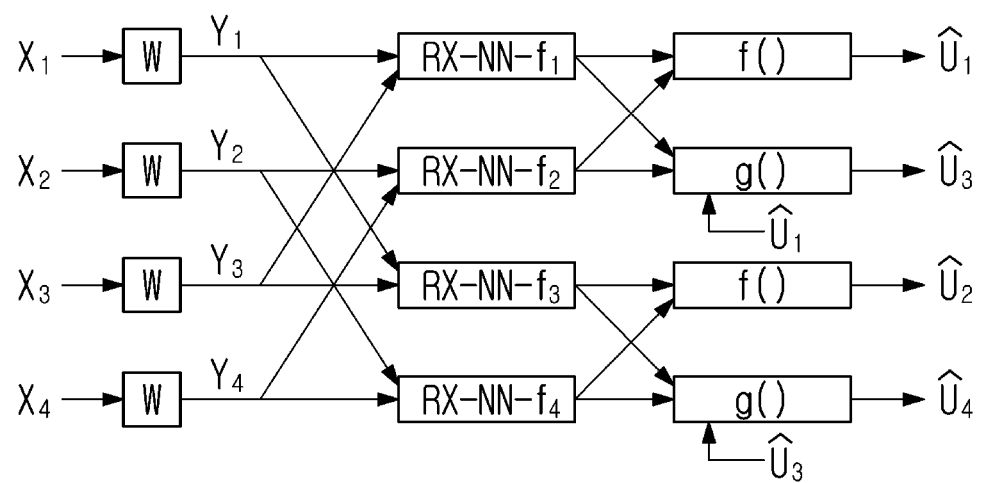
FIG. 22B is a view showing a method of performing decoding based on a neural polar code at a receiver that is applicable to the present disclosure.

As another example, FIG. 22A and FIG. 22B may also be a method of decoding a signal based on a neural polar code. As an example, referring to FIG. 22A and FIG. 22B, in each node, a part processed by TX-NN based on a decoding neural network is a part processed by a polar code in parallel, and this may be a case of decoding in a successive cancellation scheme (SC) according to each part of Tx-NN. As an example, in FIG. 22A and FIG. 22B, it may be a case where a code block length N is 4 and the number K of autoencoders is 2. As an example, the decoding procedure of FIG. 22A may be the same as the decoding procedure of FIG. 21A. Herein, referring to FIG. 22B, neural network-based decoding may be performed. As an example, the reception signal y=[Y1, Y2, Y3, Y4], which has passed through a channel, may be decoded without bit reversal. Herein, y may be a signal received from a receiver after x passes through a wireless channel. RX-NN-fi may perform decoding based on the above-described neural network, and final decoding may be performed by applying a corresponding result to f( ) and g( ) as a decoding process of the above-described polar code.

Specifically, Y1 and Y3 may pass through RX-NN-f1, and a corresponding result may be output to f( ) and g( ). In addition, Y2 and Y4 may pass through RX-NN-f2, and a corresponding result may be output to f( ) and g( ). Herein, also in training, Rx-NN-f1 and Rx-NN-f2 may set the same input and output as used at the step but may not be limited thereto.

In addition, Y1 and Y3 may pass through Rx-NN-f3, and a corresponding result may be output to f( ) and g( ). In addition, Y2 and Y4 may pass through Rx-NN-f4, and a corresponding result may be output to f( ) and g( ). In addition, as an example, also in training, Rx-NN-f3 and Rx-NN-f4 may set the same input and output as used at this step but may not be limited thereto. Next, polar code-based decoding may be performed. As an example, f( ) may use signals delivered from Rx-NN-f1 and Rx-NN-f2 as inputs, determine $\hat{U}_1$ as a result and output it. In addition, g( ) may use each of the signals delivered from Rx-NN-f1 and Rx-NN-f2 and a predetermined $\hat{U}_1$ as inputs to determine $\hat{U}_2$ as a result and output it. In addition, f( ) may use each of the signals delivered from Rx-NN-f3 and Rx-NN-f4 as inputs, determine $\hat{U}_3$ as a result and output it. In addition, g( ) may use each of the signals delivered from Rx-NN-f3 and Rx-NN-f4 and a predetermined $\hat{U}_3$ as inputs to determine $\hat{U}_4$ as a result and output it, and thus a receiver may perform decoding.

Figure 23A:
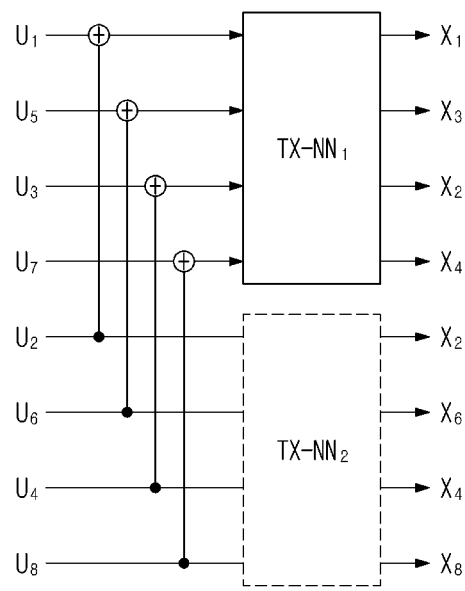
FIG. 23A is a view showing a method of performing decoding based on a neural polar code at a receiver that is applicable to the present disclosure.
Figure 23B:
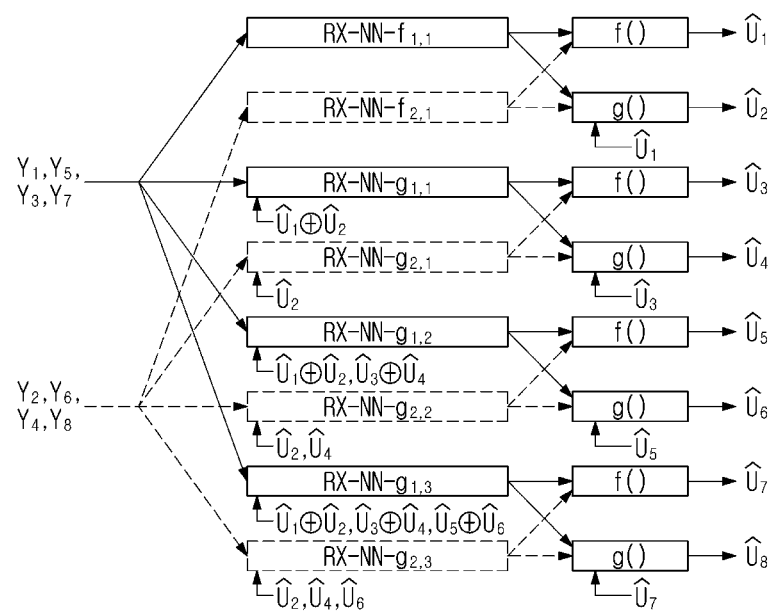
FIG. 23B is a view showing a method of performing decoding based on a neural polar code at a receiver that is applicable to the present disclosure.

As another example, FIG. 23A and FIG. 23B is a view showing a method of decoding based on a neural polar code. Referring to FIG. 23A and FIG. 23B, in each node, a part processed by TX-NN based on a decoding neural network may be processed as Rx-NN. On the other hand, a part processed by a polar code may be a case of decoding in a form compatible with an SC scheme. As an example, in FIG. 23A and FIG. 23B, it may be a case where a code block length N is 8 and the number K of autoencoders is 4, but the present disclosure may not be limited thereto. Herein, RX-NN-fi,j and RX-NN-gi,j may perform decoding based on the above-described neural network, and final decoding may be performed by applying a corresponding result to f( ) and g( ) as a decoding process of the above-described polar code.

As an example, in (a) of FIG. 23A, u=[U1 U2 U3 U4 U5 U6 U7 U8] may be an encoding input signal, and x=[X1 X2 X3 X4 X5 X6 X7 X8] may be an encoding result signal. Herein, $U_1 \oplus U_2$, $U_5 \oplus U_6$, $U_3 \oplus U_4$ and $U_7 \oplus U_8$ may be input into a 1st Tx-NN neural network. Herein, the neural network may perform encoding by using the input and output a result to X1, X5, X3 and X7. Herein, also in training, the 1st Tx-NN neural network may set the same input and output as used at the step and is not limited the above-described embodiment.

In addition, as an example, $U_2$, $U_6$, $U_4$, and $U_8$ may be input into a 2nd Tx-NN neural network. Herein, the neural network may perform encoding by using the input and output a result to X2, X6, X4 and X8. Then, a receiver may receive a y signal that has passed through a wireless channel. Herein, f( ) and g( ) may be functions described in Equation 23 and Equation 24. In addition, RX-NN-f1, 1, RX-NN-g1, 1, RX-NN-g1, 2, RX-NN-g1,3♀|•-RX-NN-f2,1, RX-NN-g2,1, RX-NN-g2,2 and RX-NN-g2,3 may be neural networks for receiver decoding. Herein, in order to reduce complexity of constructing a decoder, redundant usage of RX-NN-f1,i=RX-NN-f2,i, i=1, 2 and RX-NN-g1,i=RX-NN-g2,i, i=1, 2, 3 may be possible, which is not limited to a specific form though. In addition, as an example, RX-NN-f may mean a neural network that performs processing without feedback removal, and Rx-NN-g may mean a neural network including feedback removal.

As an example, a receiver may decode a reception signal y=[Y1, Y2, Y3, Y4, Y5, Y6, Y7, Y8], which has passed through a channel, without bit reversal. Herein, [Y1, Y5, Y3, Y7] may pass through RX-NN-f1,1 and a corresponding result may be output to f( ) and g( ). In addition, [Y2, Y6, Y4, Y8] may pass through Rx-NN-f2,1, and a corresponding result may be output to f( ) and g( ). Herein, also in training, Rx-NN-f1,1 and Rx-NN-f2,1 may be set to the same input and output as used at the step and is not limited the above-described embodiment.

As an example, f( ) may use signals delivered from Rx-NN-f1,1 and Rx-NN-f2,1 as inputs, determine $\hat{U}_1$ as a result and output it. In addition, g( ) may use each of the signals delivered from Rx-NN-f1,1 and Rx-NN-f2,1 and a predetermined $\hat{U}_1$ as inputs to determine $\hat{U}_2$ as a result and output it.

In addition, [Y1, Y5, Y3, Y7] and $\hat{U}_1 \oplus \hat{U}_2$ may pass through Rx-NN-g1,1, and a corresponding result may be output to f( ) and g( ). In addition, [Y2, Y6, Y4, Y8] and $\hat{U}_2$ may pass through Rx-NN-g2,1, and a corresponding result may be output to f( ) and g( ). In addition, also in training, Rx-NN-g1,1 and Rx-NN-g2,1 may be set to the same input and output as used at the step and is not limited the above-described embodiment. Herein, f( ) may use each of the signals delivered from Rx-NN-g1, 1 and Rx-NN-g2,1 as inputs, determine $\hat{U}_3$ as a result and output it. In addition, g( ) may use each of the signals delivered from Rx-NN-g1,1 and Rx-NN-g2,1 and a predetermined $\hat{U}_3$ as inputs to determine $\hat{U}_4$ as a result and output it. That is, [Y1, Y5, Y3, Y7], $\hat{U}_1 \oplus \hat{U}_2$ and $\hat{U}_3 \oplus \hat{U}_4$ may pass through RX-NN-g1,2, and a corresponding result may be output to f( ) and g( ). In addition, [Y2, Y6, Y4, Y8], $\hat{U}_2$ and $\hat{U}_4$ may pass through RX-NN-g2,2, and a corresponding result may be output to f( ) and g( ). Herein, also in training, Rx-NN-g1,2 and Rx-NN-g2,2 may be set to the same input and output as used at the step and is not limited the above-described embodiment.

Herein, f( ) may use signals delivered from Rx-NN-g1,2 and Rx-NN-g2,2 as inputs, determine $\hat{U}_5$ as a result and output it. In addition, g( ) may use each of the signals delivered from Rx-NN-g1,2 and Rx-NN-g2,2 and a predetermined $\hat{U}_5$ as inputs to determine $\hat{U}_6$ as a result and output it. Herein, [Y1, Y5, Y3, Y7], $\hat{U}_1 \oplus \hat{U}_2, \hat{U}_3 \oplus \hat{U}_4$ and $\hat{U}_5 \oplus \hat{U}_6$ may pass through Rx-NN-g1,3, and a corresponding result may be output to f( ) and g( ). In addition, [Y2, Y6, Y4, Y8], $\hat{U}_2, \hat{U}_4$ and $\hat{U}_6$ may pass through RX-NN-g2,3, and a corresponding result may be output to f( ) and g( ). Herein, also in training, Rx-NN-g1,3 and Rx-NN-g2,3 may be set to the same input and output as used at the step and is not limited the above-described embodiment.

In addition, f( ) may use each of the signals delivered from Rx-NN-g1,3 and Rx-NN-g2,3 as inputs to determine $\hat{U}_7$ as a result and output it, and g( ) may also use each of the signals delivered from Rx-NN-g1,3 and Rx-NN-g2,3 and a predetermined $\hat{U}_7$ as inputs to determine $\hat{U}_8$ as a result and output it. Based on what is described above, a receiver may perform decoding.

Figure 24:
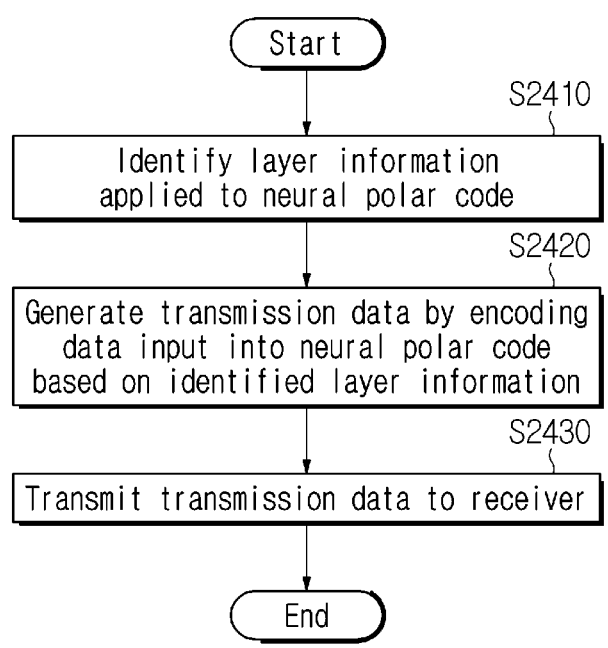
FIG. 24 is a view showing a method by which a transmitter and a receiver, which are applicable to the present disclosure, transmit and receive a signal based on a neural network.

FIG. 24 is a view showing a method of performing encoding in a transmitter based on a neural polar code.

Referring to FIG. 24, a transmitter may check layer information applied to a neural polar code (S2410). Herein, the transmitter may be a terminal, and a receiver may be a base station. In addition, as an example, the transmitter may be a base station, and the receiver may be a terminal. As another example, both the transmitter and the receiver may be a terminal and are not limited to a specific case. However, for convenience of explanation, the description below is based on a case where the transmitter is a terminal and the receiver is a base station.

Herein, layer information may be information on a layer where polar code transformation in a neural polar code is applied. As an example, when data is encoded based on a neural polar code, polar code transformation may be applied for bits of input data that are input into the neural polar code. Herein, among bits of the input data, polar code transformation may be applied only to data that are not adjacent. As another example, among bits of the input data, polar code transformation may be applied only to bits that are a preset distance apart from each other. That is, polar code transformation may be applied based on bits that are not adjacent. Next, for bits that are output through polar code transformation, encoding may be performed based on an autoencoder. Herein, in the neural polar code, the autoencoder may be applied in a first layer. That is, after polar code transformation is applied for data bits, the autoencoder may applied in the first layer. Herein, the autoencoder may input as many bits as an adjacent first bit number. Herein, the autoencoder may be configured to perform encoding through training based on the neural network. As an example, neural network-based training may increase training complexity exponentially along with an increase of block size, and in consideration of what is described above, the autoencoder may be applied starting from the first layer. Next, encoding may be performed based on the autoencoder, and transmission data may be generated (S2420). Next, the transmitter may transmit the transmission data to the receiver through a wireless channel (S2430). In addition, as an example, data input into a neural polar code may be constructed with a second bit number. Herein, since an adjacent bit number processed based on the autoencoder may be the first bit number, the autoencoder may require as many bits as the second bit number divided by the first bit number.

As another example, the transmitter may use only one autoencoder. As an example, adjacent bits in the first layer, which are applied to the autoencoder, may be distinguished based on a time division scheme. Specifically, a first group bit, which is constructed by the first bit number in the first layer by applying polar code transformation, may be encoded through the one autoencoder at a first time, and a second group bit, which is constructed by the first bit number in the first layer by applying polar code transformation, may be encoded through one autoencoder at a second time. That is, the transmitter may use only one autoencoder, and input bits for the autoencoder may be separately input in a time division scheme, so that complexity of implementing a terminal can be reduced.

As another example, layer information applied to a neural polar code may be information that is preset in a transmitter and a receiver.

As another example, a transmitter may receive a reference signal from a receiver, perform channel measurement, transmit the measured channel information to the receiver, and then receive layer information applied to a neural polar code from the receiver through control information. That is, layer information may be information that varies, the transmitter and the receiver may use another piece of layer information by considering a channel environment, and thus an autoencoder may be applied in different layers. More specifically, as an example, a layer in which an autoencoder is applied may be configured as index information, a receiver may transmit index information for the layer to a transmitter based on a channel environment, and the transmitter may apply the autoencoder based on the index information and then perform encoding, so that data transmission can be performed through a wireless channel.

In addition, as an example, in case layer information indicates that the autoencoder is not applied in every layer, data may be encoded by applying polar code transformation alone. On the other hand, when it is indicated that an autoencoder is not used in every layer or a transmitter cannot receive control information from a receiver, the transmitter may encode data only through polar code transformation and perform transmission through a wireless channel but is not limited to the above-described embodiment.

FIG. 25 is a view showing a method of performing decoding in a receiver based on a neural polar code.

Referring to FIG. 25, a receiver may receive transmission data, which is encoded based on a neural polar code, through a wireless channel (S2510). Next, the receiver may perform decoding for the transmission data that is received through the wireless channel. Herein, a transmitter may be a terminal, and the receiver may be a base station. In addition, as an example, the transmitter may be a base station, and the receiver may be a terminal. As another example, both the transmitter and the receiver may be a terminal and are not limited to a specific case. However, for convenience of explanation, the description below is based on a case where the transmitter is a terminal and the receiver is a base station.

Herein, layer information may be information on a layer where polar code transformation in a neural polar code is applied. As an example, since the receiver receives transmission data to which polar code transformation and an autoencoder are applied based on a neural polar network, it may perform polar code-based decoding after performing neural network-based decoding, which may be the same as described in FIG. 21 to FIG. 23A and FIG. 23B.

As another example, it is possible to consider a device that includes at least one memory and at least one processor functionally coupled with the at least one memory. Herein, the at least one processor may control the device to identify layer information applied to a neural polar code, to generate transmission data by encoding data input into the neural polar code based on the identified layer information, and to transmit the transmission data to a base station. Herein, the neural polar code may generate the transmission data by performing encoding based on polar code transformation from an initial layer of data to a first layer according to the identified layer information and by performing encoding through a neural network-based autoencoder after the first layer until the transmission data is generated.

As another example, it is possible to consider a non-transitory computer-readable medium storing at least one instruction. Herein, at least one instruction, which is executable by a processor, may be included, and the at least one instruction may instruct a device to identify layer information applied to a neural polar code, to generate transmission data by encoding data input into the neural polar code based on the identified layer information, and to transmit the transmission data to a base station, and the neural polar code may generate the transmission data by performing encoding based on polar code transformation from an initial layer of data to a first layer according to the identified layer information and by performing encoding through a neural network-based autoencoder after the first layer until the transmission data is generated, and this is the same as described above.

As the examples of the proposal method described above may also be included in one of the implementation methods of the present disclosure, it is an obvious fact that they may be considered as a type of proposal methods. In addition, the proposal methods described above may be implemented individually or in a combination (or merger) of some of them. A rule may be defined so that information on whether or not to apply the proposal methods (or information on the rules of the proposal methods) is notified from a base station to a terminal through a predefined signal (e.g., a physical layer signal or an upper layer signal).

The present disclosure may be embodied in other specific forms without departing from the technical ideas and essential features described in the present disclosure. Therefore, the above detailed description should not be construed as limiting in all respects and should be considered as an illustrative one. The scope of the present disclosure should be determined by rational interpretation of the appended claims, and all changes within the equivalent scope of the present disclosure are included in the scope of the present disclosure. In addition, claims having no explicit citation relationship in the claims may be combined to form an embodiment or to be included as a new claim by amendment after filing.

The invention claimed is:

1. A method of operating user equipment (UE) in a wireless communication system, the method comprising:
   receiving a reference signal from a base station;
   performing a channel measurement to obtain channel information,
   transmitting the channel information to the base station;
   in response to the channel information, receiving layer information applied to a neural polar code from the base station through control information;
   generating at least one codeword by encoding data;
   generating modulation symbols based on the at least one codeword; and
   transmitting signals comprising the modulation symbols,
   wherein the data is encoded by the neural polar code based on the layer information,
   wherein the neural polar code:
      performs encoding from an initial layer to a first layer according to the identified layer information based on a polar code transformation, and
      performs encoding from the first layer to the generated encoded data based on a neural network-based autoencoder.

2. The method of claim 1, wherein the autoencoder performs the encoding through training based on the neural network, and wherein bits including a first number of bits are input and encoded in the autoencoder.

3. The method of claim 2, wherein the first layer where the autoencoder is applied is determined based on the first number.

4. The method of claim 2, wherein data, which is input into the neural polar code, includes a second number of bits, and
wherein the polar code transformation is applied to bits that are not adjacent, among bits of the data, based on the second number from the initial layer to the first layer.

5. The method of claim 4,
wherein the UE has at least one autoencoder as many as a number of the second number divided by the first number, and
wherein the at least one autoencoder includes the autoencoder.

6. The method of claim 4, wherein the UE has a single autoencoder including the autoencoder, and
wherein adjacent bits applied to the autoencoder in the first layer are distinguished based on a time division scheme.

7. The method of claim 6, wherein a first group bit, which is constructed by the first number in the first layer by applying the polar code transformation, is encoded through the one autoencoder at a first time, and a second group bit, which is constructed by the first number in the first layer by applying the polar code transformation, is encoded through the one autoencoder at a second time.

8. The method of claim 1, wherein the layer information, which is applied to the neural polar code, is information that is preset in the UE.

9. The method of claim 1, wherein, based on the layer information indicating that the autoencoder is not applied in every layer, the data is encoded by applying only the polar code transformation.

10. A method of operating a base station in a wireless communication system, the method comprising:
transmitting a reference signal to a user equipment (UE);
receiving channel information from the UE;
in response to the channel information, transmitting layer information applied to a neural polar code to the UE through control information;
receiving signals comprising the modulation symbols,
generating at least one codeword based on the modulation symbols; and
generating encoded data based on the at least one codeword;
wherein the encoded data is decoded by the neural polar code based on the layer information,
wherein the neural polar code:
performs decoding the encoded data to a first layer using the identified layer information based on a neural network, and
performs decoding based on a polar code transformation after the first layer.

11. User equipment (UE) transmitting a signal in a wireless communication system, the UE comprising:
a transceiver; and
a processor coupled with the transceiver,
wherein the processor is configured to:
receive a reference signal from a base station;
perform a channel measurement to obtain channel information,
transmit the channel information to the base station;
in response to the channel information, receive layer information applied to a neural polar code from the base station through control information;
generate at least one codeword by encoding data,
generate modulation symbols based on the at least one codeword, and
transmit signals comprising the modulation symbols,
wherein the data is encoded by the neural polar code based on the layer information,
wherein the neural polar code:
performs encoding from an initial layer of the data to a first layer according to the identified layer information based on a polar code transformation, and
performs encoding from the first layer to the generated encoded data based on a neural network-based autoencoder.

* * * * *